(12) United States Patent
Kim et al.

(10) Patent No.: US 11,069,698 B2
(45) Date of Patent: Jul. 20, 2021

(54) THREE-DIMENSIONAL SEMICONDUCTOR MEMORY DEVICE

(71) Applicant: Samsung Electronics Co., Ltd., Suwon-si (KR)

(72) Inventors: Junhyoung Kim, Seoul (KR); Kwang-Soo Kim, Hwaseong-si (KR); Geunwon Lim, Yongin-si (KR); Jisung Cheon, Ansan-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 16/398,442

(22) Filed: Apr. 30, 2019

(65) Prior Publication Data
US 2020/0066742 A1 Feb. 27, 2020

(30) Foreign Application Priority Data
Aug. 22, 2018 (KR) .................. 10-2018-0098149

(51) Int. Cl.
*H01L 27/11565* (2017.01)
*H01L 27/11582* (2017.01)
*H01L 27/11573* (2017.01)
*H01L 21/311* (2006.01)

(52) U.S. Cl.
CPC .. *H01L 27/11565* (2013.01); *H01L 27/11573* (2013.01); *H01L 27/11582* (2013.01); *H01L 21/31111* (2013.01); *H01L 21/31116* (2013.01)

(58) Field of Classification Search
CPC ......... H01L 27/11565; H01L 27/11582; H01L 27/11573; H01L 21/31116; H01L 21/31111; H01L 27/11575
See application file for complete search history.

(56) References Cited

U.S. PATENT DOCUMENTS

| | | | |
|---|---|---|---|
| 8,394,716 B2 | 3/2013 | Hwang et al. | |
| 8,933,502 B2 | 1/2015 | Higashitani et al. | |
| 9,837,433 B2 | 12/2017 | Oh et al. | |
| 10,115,681 B1* | 10/2018 | Ariyoshi | H01L 23/564 |
| 2010/0258947 A1* | 10/2010 | Jeong | H01L 27/11565 |
| | | | 257/774 |
| 2011/0266604 A1 | 11/2011 | Kim et al. | |
| 2015/0162345 A1 | 6/2015 | Lee et al. | |
| 2017/0084624 A1* | 3/2017 | Lee | H01L 27/1157 |
| 2017/0179154 A1* | 6/2017 | Furihata | H01L 27/0288 |
| 2017/0236830 A1* | 8/2017 | Inatsuka | H01L 27/11582 |
| | | | 257/620 |
| 2017/0309634 A1 | 10/2017 | Noguchi et al. | |
| 2017/0352678 A1 | 12/2017 | Lu et al. | |
| 2019/0043879 A1* | 2/2019 | Lu | H01L 27/11573 |
| 2019/0057974 A1* | 2/2019 | Lu | H01L 27/11565 |

* cited by examiner

*Primary Examiner* — Marcos D. Pizarro
*Assistant Examiner* — Sue Tang
(74) *Attorney, Agent, or Firm* — Muir Patent Law, PLLC

(57) ABSTRACT

A three-dimensional semiconductor memory device may include a first stack block including first stacks arranged in a first direction on a substrate, a second stack block including second stacks arranged in the first direction on the substrate, and a separation structure provided on the substrate between the first stack block and the second stack block. The separation structure may include first mold layers and second mold layers, which are stacked in a vertical direction perpendicular to a top surface of the substrate.

20 Claims, 28 Drawing Sheets

THREE-DIMENSIONAL SEMICONDUCTOR MEMORY DEVICE

CROSS-REFERENCE TO RELATED APPLICATIONS

This U.S. non-provisional patent application claims priority under 35 U.S.C. § 119 to Korean Patent Application No. 10-2018-0098149, filed on Aug. 22, 2018, in the Korean Intellectual Property Office, the entire contents of which are hereby incorporated by reference.

BACKGROUND OF THE INVENTION

The present disclosure relates to a semiconductor memory device and, in particular, to a three-dimensional semiconductor memory device.

Higher integration of semiconductor memory devices is increasingly used to satisfy consumer demands for superior performance and inexpensive prices. In the case of semiconductor memory devices, since their integration is an important factor in determining product prices, increased integration is especially demanded. In the case of two-dimensional or planar semiconductor memory devices, since their integration is mainly determined by the area occupied by a unit memory cell, integration is greatly influenced by the level of a fine pattern forming technology. However, the extremely expensive process equipment needed to increase pattern fineness sets a practical limitation on increasing integration for two-dimensional or planar semiconductor devices. To overcome such a limitation, three-dimensional semiconductor memory devices including three-dimensionally arranged memory cells have recently been proposed.

SUMMARY

Some embodiments provide a three-dimensional semiconductor memory device having a reduced chip size.

According to some embodiments, the disclosure is directed to a three-dimensional semiconductor memory device, comprising: a first stack block including first stacks arranged in a first direction on a substrate; a second stack block including second stacks arranged in the first direction on the substrate; and a separation structure provided on the substrate between the first stack block and the second stack block, the separation structure including first mold layers and second mold layers.

According to some embodiments, the disclosure is directed to a three-dimensional semiconductor memory device, comprising: a first stack and a second stack provided on a substrate to be spaced apart from each other in a first direction and to extend lengthwise in a second direction crossing the first direction; a first bit line crossing the first stack and extending lengthwise in the first direction; a second bit line crossing the second stack and extending lengthwise in the first direction, the first and second bit lines being aligned with each other in the first direction; and a separation structure between the first stack and the second stack, wherein a first side surface of the first stack adjacent to the separation structure and a first side surface of the second stack adjacent to the separation structure are perpendicular to a top surface of the substrate.

According to some embodiments, the disclosure is directed to a three-dimensional semiconductor memory device, comprising: stacks on a substrate; a separation structure on the substrate between the stacks; and a contact structure between the separation structure and each of the stacks.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 19A to 22A are sectional views, which are taken along line I-I' of FIG. 4 to illustrate a method of fabricating a three-dimensional semiconductor memory device according to example embodiments.

FIGS. 19B to 22B are sectional views, which are taken along line II-II' of FIG. 4, to illustrate a method of fabricating a three-dimensional semiconductor memory device according to example embodiments.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Figure 1:
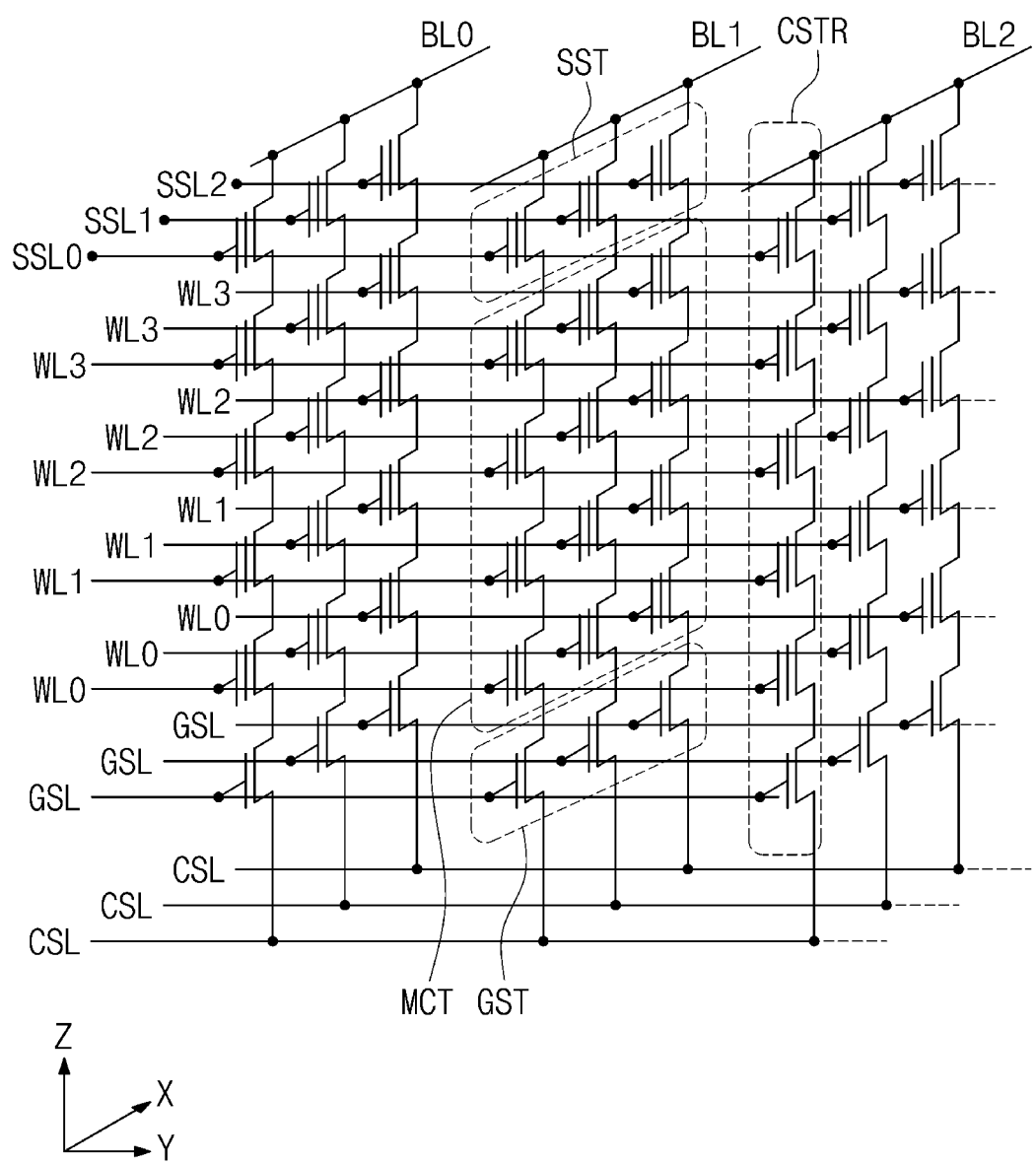
FIG. 1 is a circuit diagram schematically illustrating a cell array of a three-dimensional semiconductor memory device according to example embodiments.

FIG. 1 is a circuit diagram schematically illustrating a cell array of a three-dimensional semiconductor memory device according to example embodiments.

Referring to FIG. 1, a three-dimensional semiconductor memory device may include a common source line CSL, a plurality of bit lines BL0-BL2, and a plurality of cell strings CSTR between the common source line CSL and the bit lines BL0-BL2.

The bit lines BL0-BL2 may be two-dimensionally arranged on a substrate, and a plurality of the cell strings CSTR may be electrically connected in parallel to each of the bit lines BL0-BL2. Accordingly, the cell strings CSTR may also be two-dimensionally arranged on the common source line CSL or the substrate.

Each of the cell strings CSTR may include a ground selection transistor GST connected to the common source line CSL, a string selection transistor SST connected to one of the bit lines BL0-BL2, and a plurality of memory cell transistors MCT provided between the ground and string selection transistors GST and SST. The ground selection transistor GST, the memory cell transistors MCT, and the string selection transistor SST constituting each of the cell strings CSTR may be connected in series. Furthermore, a ground selection line GSL, a plurality of word lines WL0-WL3, and a plurality of string selection lines SSL0-SSL2 may be provided between the common source line CSL and the bit lines BL0-BL2 and may be used as gate electrodes of the ground selection transistor GST, the memory cell transistors MCT, and the string selection transistors SST, respectively.

Figure 2:
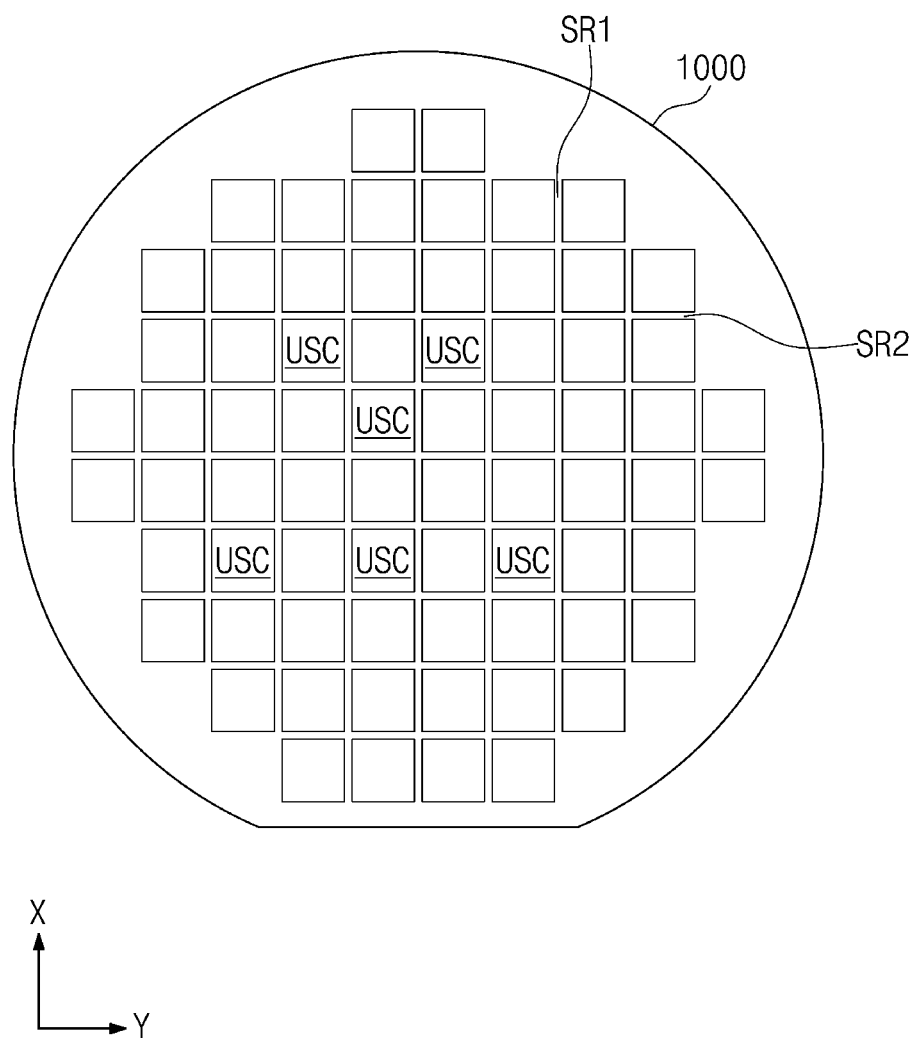
FIG. 2 is a plan view illustrating a semiconductor wafer including a three-dimensional semiconductor memory device according to example embodiments.
Figure 3:
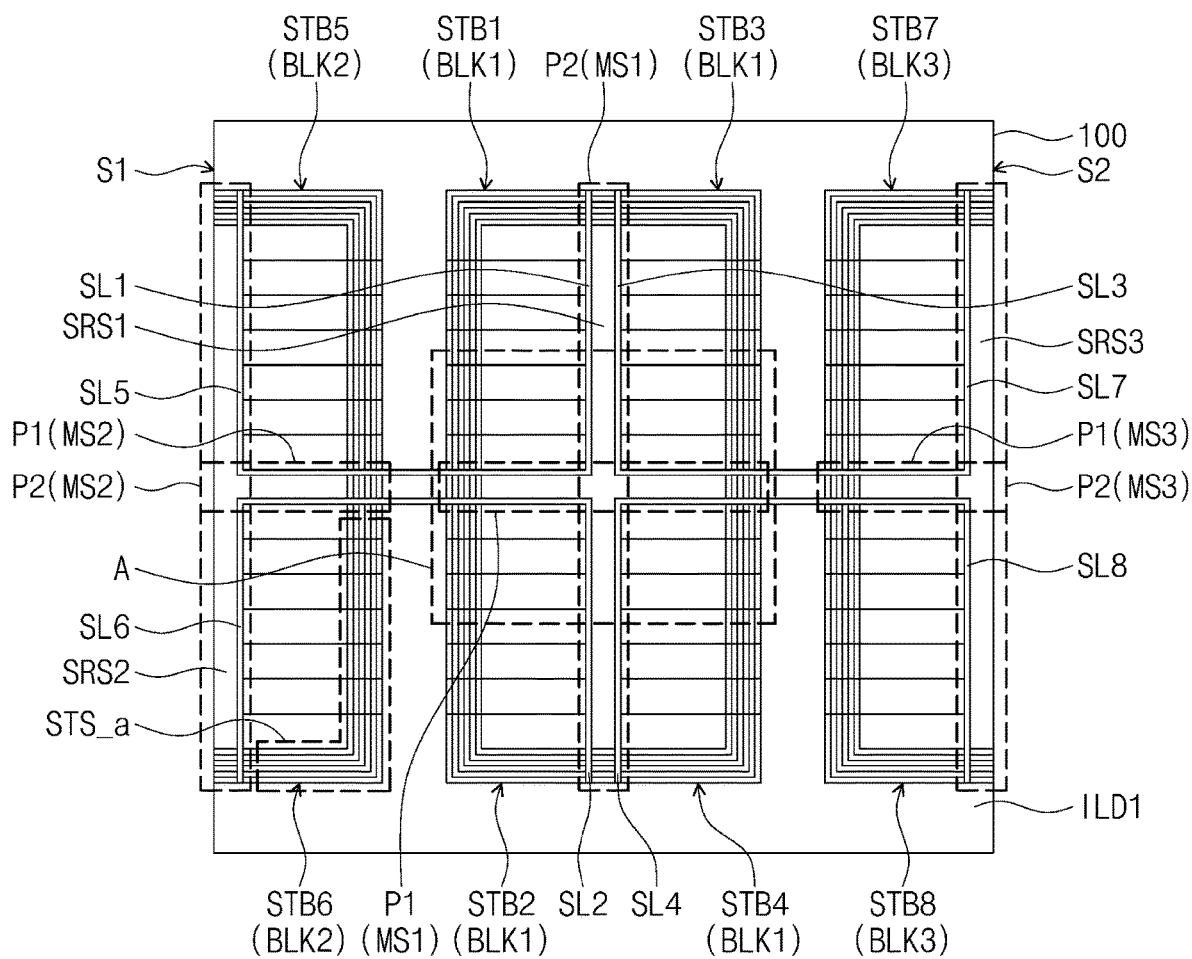
FIG. 3 is an enlarged plan view illustrating a semiconductor chip of FIG. 2.
Figure 4:
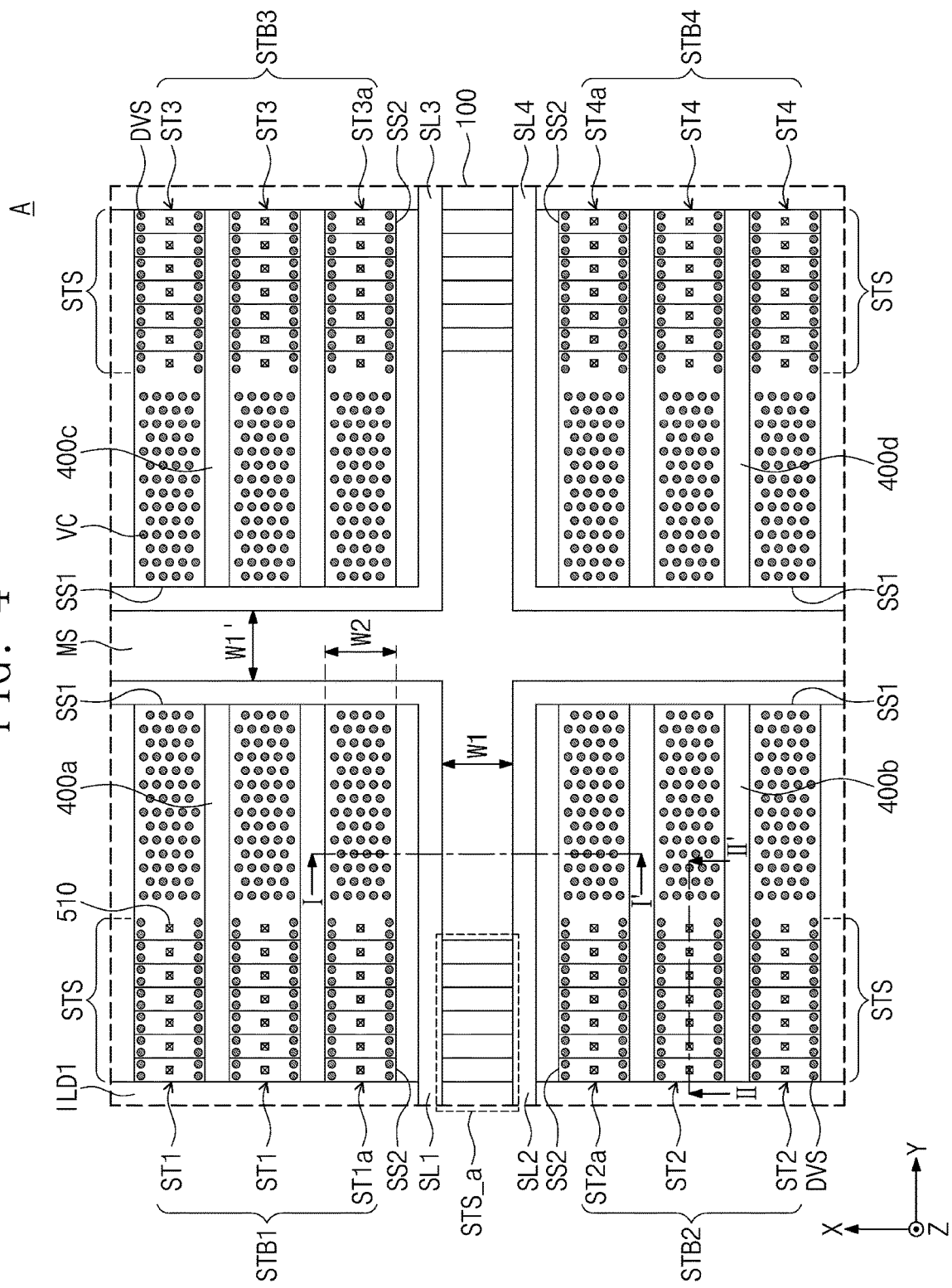
FIG. 4 is an enlarged plan view illustrating a portion 'A' of FIG. 3.
Figure 5:
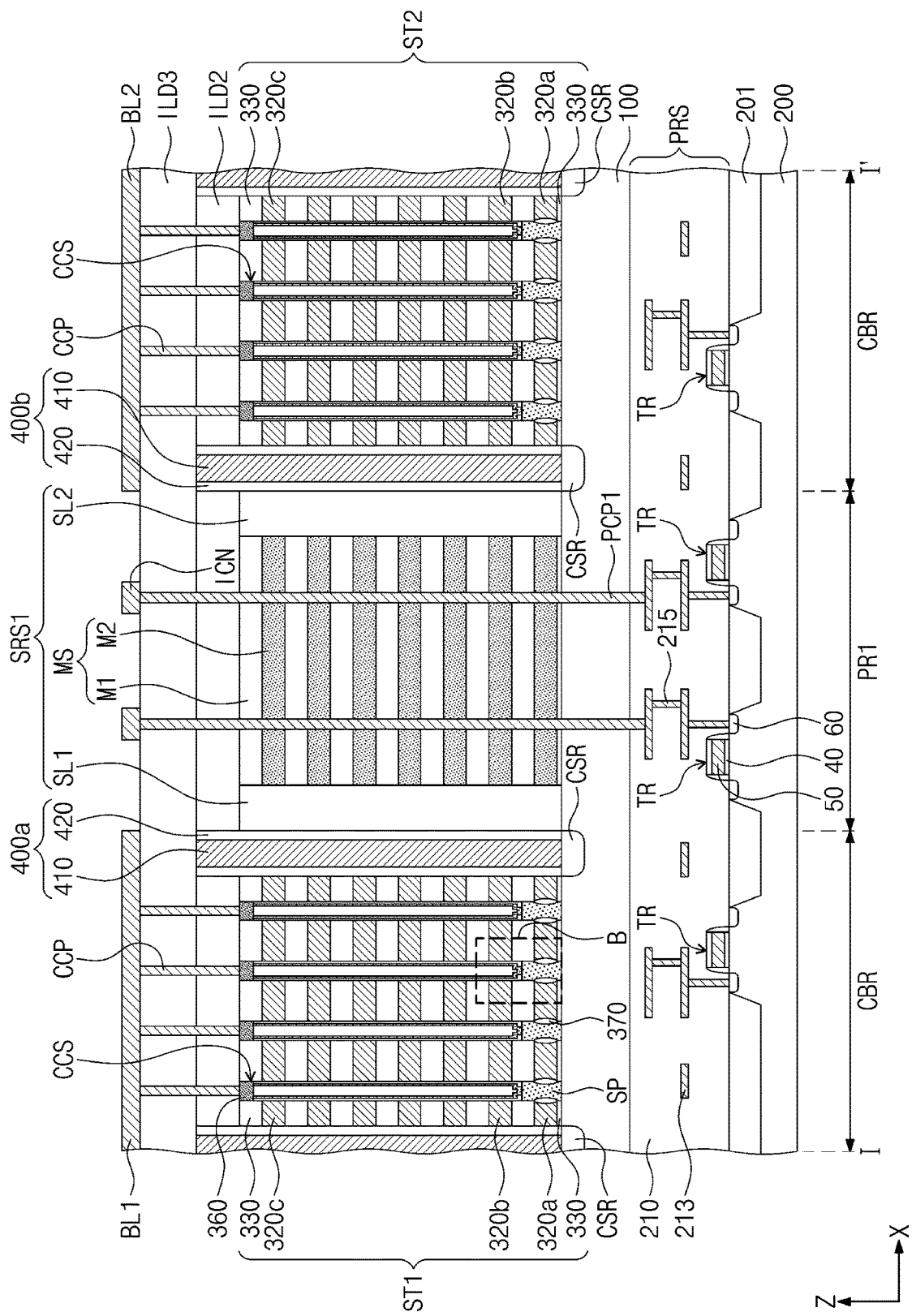
FIG. 5 is a sectional view, which is taken along line I-I' of FIG. 4, to illustrate a three-dimensional semiconductor memory device according to example embodiments.
Figure 6:
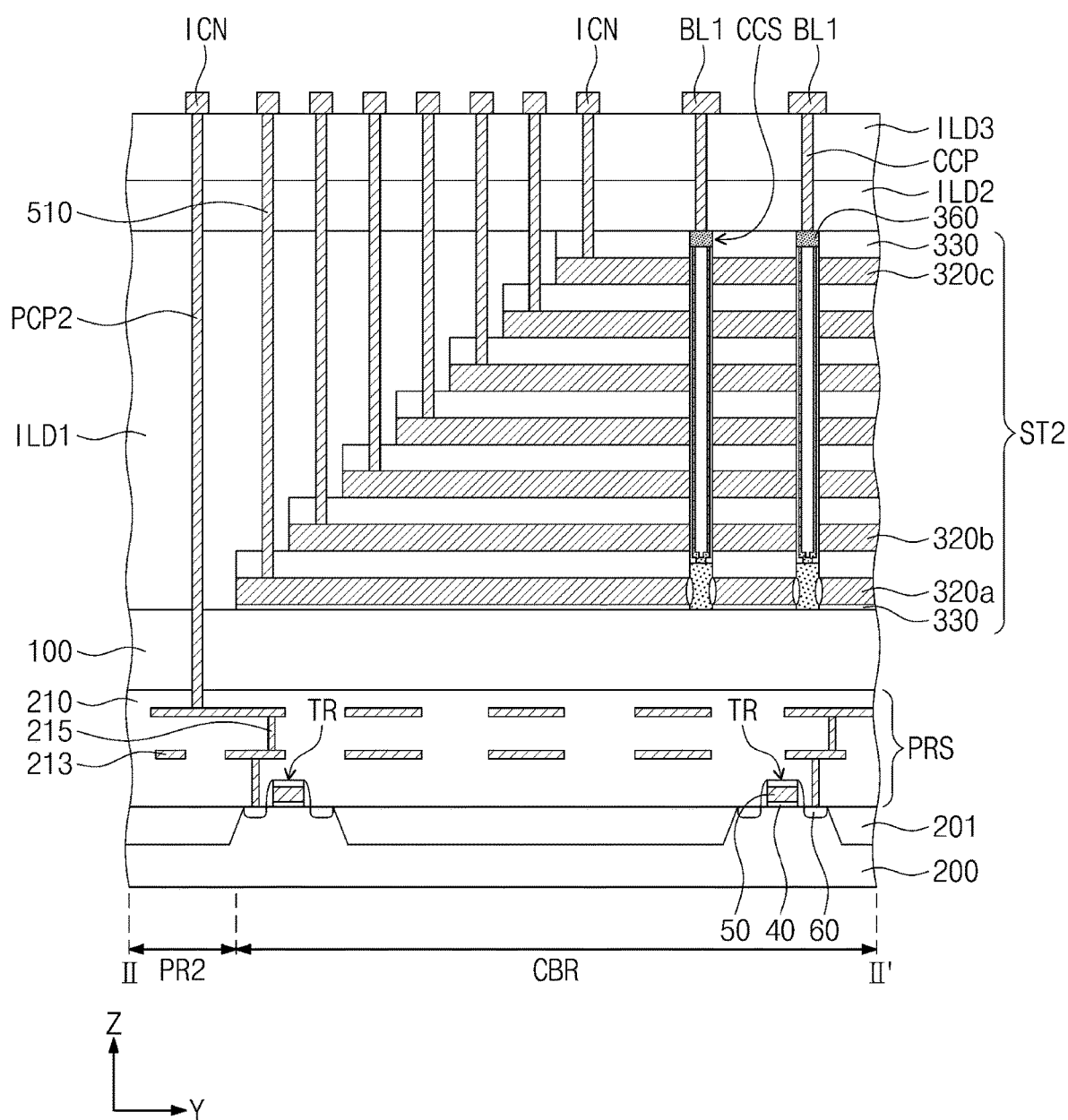
FIG. 6 is a sectional view, which is taken along line II-II' of FIG. 4 to illustrate a three-dimensional semiconductor memory device according to example embodiments.
Figure 7:
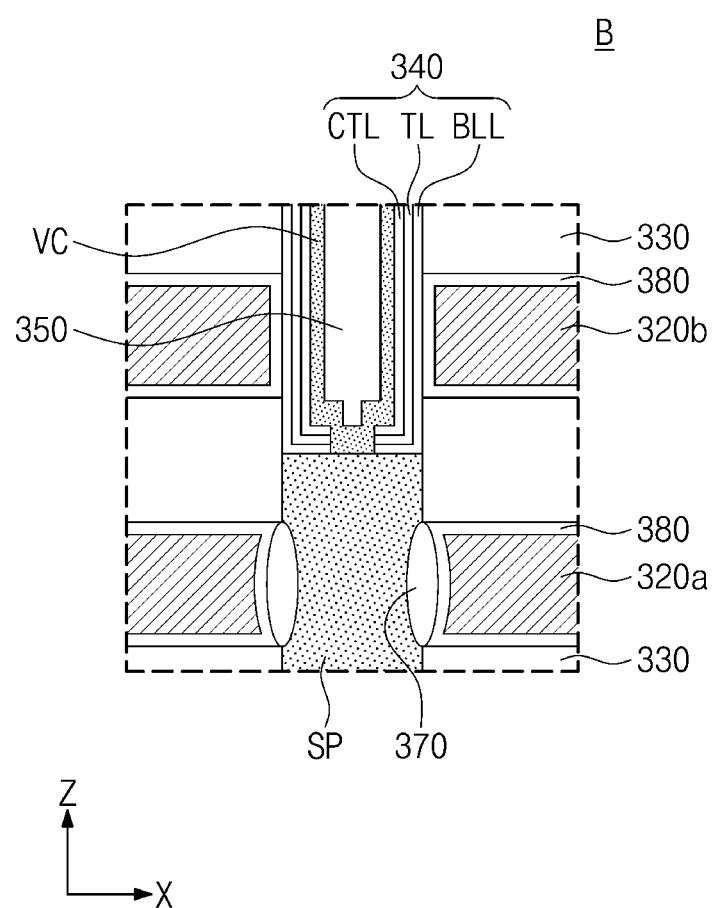
FIG. 7 is an enlarged sectional view illustrating a portion 'B' of FIG. 5.

FIG. 2 is a plan view illustrating a semiconductor wafer including a three-dimensional semiconductor memory device according to example embodiments. FIG. 3 is an enlarged plan view illustrating a semiconductor chip of FIG. 2. FIG. 4 is an enlarged plan view illustrating a portion 'A' of FIG. 3. FIG. 5 is a sectional view, which is taken along line I-I' of FIG. 4 to illustrate a three-dimensional semiconductor memory device according to example embodiments. FIG. 6 is a sectional view, which is taken along line II-II' of FIG. 4 to illustrate a three-dimensional semiconductor memory device according to example embodiments. FIG. 7 is an enlarged sectional view illustrating a portion 'B' of FIG. 5.

Referring to FIGS. 2 and 3, a semiconductor wafer 1000 may include a plurality of unit chips USC. Each unit chip USC may be a semiconductor chip. The unit chips USC may be spaced apart from each other in a first direction X and in a second direction Y crossing the first direction X. The semiconductor wafer 1000 may include scribe regions SR1 and SR2 defining the unit chips USC. The scribe regions SR1 and SR2 may include a first scribe region SR1 extending in the first direction X and a second scribe region SR2 extending in the second direction Y.

Each of the unit chips USC may include a substrate 100, blocks BLK1, BLK2, and BLK3, separation structures SRS1, SRS2, and SRS3, and a first interlayered insulating layer ILD1. The blocks BLK1, BLK2, and BLK3 may be provided on the substrate 100. The blocks BLK1, BLK2, and BLK3 may be spaced apart from each other in the second direction Y, on a top surface of the substrate 100. The blocks BLK1, BLK2, and BLK3 may include first to third blocks BLK1, BLK2, and BLK3. The second block BLK2 and the third block BLK3 may be spaced apart from each other in the second direction Y on the substrate 100, and the first block BLK1 may be provided between the second block BLK2 and the third block BLK3. The first interlayered insulating layer ILD1 may be provided on the substrate 100. The first interlayered insulating layer ILD1 may be provided to cover side surfaces of the blocks BLK1, BLK2, and BLK3 and the top surface of the substrate 100.

The first to third separation structures SRS1, SRS2, and SRS3 may be provided on the top surface of the substrate 100. For example, the first separation structure SRS1 may be provided on the top surface of the substrate 100 to penetrate the first block BLK1 in the third direction Z, which is perpendicular to both the first direction X and the second direction Y. The first separation structure SRS1 may include a first mold structure MS1 and first to fourth separation layers SL1, SL2, SL3, and SL4. The first mold structure MS1 may include a first portion P1 and a second portion P2. The first portion P1 of the first mold structure MS1 may penetrate the first block BLK1 in the third direction Z and may extend lengthwise in the second direction Y. The second portion P2 of the first mold structure MS1 may penetrate the first block BLK1 in the third direction Z and may extend lengthwise in the first direction X. An item, layer, or portion of an item or layer described as extending "lengthwise" in a particular direction has a length in the particular direction and a width perpendicular to that direction, where the length is greater than the width. The first portion P1 and the second portion P2 of the first mold structure MS1 may cross each other. The first block BLK1 may be divided into first to fourth stack blocks STB1, STB2, STB3, and STB4 by the first mold structure MS1. The first and second stack blocks STB1 and STB2 may be spaced apart from each other in the first direction X with the first portion P1 of the first mold structure MS1 interposed therebetween, and the third and fourth stack blocks STB3 and STB4 may be spaced apart from each other in the first direction X with the first portion P1 of the first mold structure MS1 interposed therebetween. The first and third stack blocks STB1 and STB3 may be spaced apart from each other in the second direction Y with the second portion P2 of the first mold structure MS1 interposed therebetween, and the second and fourth stack blocks STB2 and STB4 may be spaced apart from each other in the second direction Y with the second portion P2 of the first mold structure MS1 interposed therebetween. The first separation layer SL1 may be provided between the first mold structure MS1 and the first stack block STB1, and the second separation layer SL2 may be provided between the first mold structure MS1 and the second stack block STB2. The third separation layer SL3 may be provided between the first mold structure MS1 and the third stack block STB3, and the fourth separation layer SL4 may be provided between the first mold structure MS1 and the fourth stack block STB4.

The second separation structure SRS2 may be provided on the top surface of the substrate 100 to penetrate the second block BLK2 in the third direction Z. The second separation structure SRS2 may include a second mold structure MS2 and fifth and sixth separation layers SL5 and SL6. The second mold structure MS2 may include a first portion P1 and a second portion P2. The first portion P1 of the second mold structure MS2 may penetrate the second block BLK2 in the third direction Z and may extend lengthwise in the second direction Y. The second portion P2 of the second mold structure MS2 may be provided on the top surface of the substrate 100 to extend lengthwise in the first direction X along a side surface of the second block BLK2. A side surface of the second portion P2 of the second mold structure MS2 may be aligned to a first side surface S1 of the substrate 100. The second block BLK2 may be divided into fifth and sixth stack blocks STB5 and STB6 by the first portion P1 of the second mold structure MS2. The fifth and sixth stack blocks STB5 and STB6 may be spaced apart from each other in the first direction X with the first portion P1 of the second mold structure MS2 interposed therebetween. The fifth separation layer SL5 may be provided between the fifth structure block STB5 and the second mold structure MS2, and the sixth separation layer SL6 may be provided between the second mold structure MS2 and the sixth stack block STB6.

The third separation structure SRS3 may be provided on the top surface of the substrate 100 to penetrate the third block BLK3 in the third direction Z. The third separation structure SRS3 may include a third mold structure MS3 and seventh and eighth separation layers SL7 and SL8. The third mold structure MS3 may include a first portion P1 and a second portion P2. The first portion P1 of the third mold structure MS3 may penetrate the third block BLK3 in the third direction Z and may extend lengthwise in the second direction Y. The second portion P2 of the third mold structure MS3 may be provided on the top surface of the substrate 100 to extend lengthwise along a side surface of the third block BLK3. A side surface of the second portion P2 of the third mold structure MS3 may be aligned to a second side surface S2 of the substrate 100 parallel to the first side surface S1. The third block BLK3 may be divided into seventh and eighth stack blocks STB7 and STB8 by the first portion P1 of the third mold structure MS3. The seventh and eighth stack blocks STB7 and STB8 may be spaced apart from each other in the first direction X with the first portion P1 of the third mold structure MS3 interposed therebetween. The seventh separation layer SL7 may be provided between the third mold structure MS3 and the seventh stack block STB7, and the eighth separation layer SL8 may be provided between the third mold structure MS3 and the eighth stack block STB8.

End portions of each of the first to third mold structures MS1, MS2, and MS3 in contact with the first interlayered insulating layer ILD1 may be provided to form a staircase structure STS_a (e.g., see FIG. 4). The first to eighth separation layers SL1-SL8 may consist of a single layer. The first separation layer SL1 and the fifth separation layer SL5 each include portions that may extend lengthwise in the second direction Y, may penetrate the first interlayered insulating layer ILD1, and may be connected to each other. The second separation layer SL2 and the sixth separation layer SL6 each include portions that may extend in the second direction Y, may penetrate the first interlayered insulating layer ILD1, and may be connected to each other.

The third separation layer SL3 and the seventh separation layer SL7 each include portions that may extend in the second direction Y, may penetrate the first interlayered insulating layer ILD1, and may be connected to each other. The fourth separation layer SL4 and the eighth separation layer SL8 each include portions that may extend in the second direction Y, may penetrate the first interlayered insulating layer ILD1, and may be connected to each other. The first to third separation structures SRS1-SRS3 may have the same stacking structure. Thus, one (e.g., the first separation structure SRS1) of the first to third separation structures SRS1-SRS3 will be exemplarily described in more detail with reference to FIGS. 3 to 7.

Each of side surfaces of the first to fourth stack blocks STB1-STB4 in contact with the first separation structure SRS1 may be a flat surface that is perpendicular to the top surface of the substrate 100 or is parallel to a third direction Z. For example, each of the side surfaces of the first to fourth stack blocks STB1-STB4 in contact with the first separation structure SRS1 may be substantially vertical. Each of side surfaces of the fifth and sixth stack blocks STB5 and STB6 in contact with the second separation structure SRS2 may be a flat surface that is perpendicular to the top surface of the substrate 100 or is parallel to a third direction Z. For example, each of the side surfaces of the fifth and sixth stack blocks STB5 and STB6 in contact with the second separation structure SRS2 may be substantially vertical. Each of side surfaces of the seventh and eighth stack blocks STB7 and STB8 in contact with the third separation structure SRS3 may be a flat surface that is perpendicular to the top surface of the substrate 100 or is parallel to a third direction Z. For example, each of the side surfaces of the seventh and eighth stack blocks STB7 and STB8 in contact with the third separation structure SRS3 may be substantially vertical.

Each of the first to eighth stack blocks STB1-STB8 may include the stacks ST (e.g., see FIG. 4), which are arranged in the first direction X and extend lengthwise in the second direction Y, and contact structures 400a, 400b, 400c, 400d (e.g., see FIG. 4), which are provided between adjacent ones of the stacks ST and between the stacks ST and the separation structures SRS1-SRS3. Some (e.g., STB1-STB4) of the first to eighth stack blocks STB1-STB8 will be exemplarily described in more detail with reference to FIGS. 3 to 7.

Referring to FIGS. 4 to 6, a three-dimensional semiconductor memory device may include a lower substrate 200, a peripheral circuit structure PRS, a substrate 100, and first to fourth stacks ST1a-ST4a and ST1-ST4. The lower substrate 200 may be a silicon substrate, a silicon-germanium substrate, a germanium substrate, or a single-crystalline epitaxial layer grown on a single-crystalline silicon substrate. A device isolation layer 201 may be provided in the lower substrate 200. The device isolation layer 201 may define active regions of the lower substrate 200. The device isolation layer 201 may include an insulating material (e.g., silicon oxide layer).

The peripheral circuit structure PRS may be provided on the lower substrate 200. The peripheral circuit structure PRS may include a transistors TR, a peripheral interlayered insulating layer 210, interconnection pads 213, and vias 215. The transistors TR may be provided on the active regions of the lower substrate 200. The transistors TR may include a peripheral gate insulating layer 40, a peripheral gate electrode 50, and source/drain regions 60. The peripheral interlayered insulating layer 210 may be provided on the lower substrate 200. The peripheral interlayered insulating layer 210 may cover the transistors TR. The interconnection pads 213 and the vias 215 may be provided in the peripheral interlayered insulating layer 210. The interconnection pads 213 located at different levels may be connected to each other through the vias 215 therebetween. Furthermore, the transistors TR may be connected to the interconnection pads 213 through the vias 215.

The substrate 100 may be provided on the peripheral circuit structure PRS. The substrate 100 may include cell block regions CBR and peripheral regions PR1 and PR2. The cell block regions CBR may be spaced apart from each other in the first and second directions X and Y, and the peripheral regions PR1 and PR2 may define the cell block regions CBR. The peripheral regions PR1 and PR2 may include a first peripheral region PR1 and a second peripheral region PR2. The first separation structure SRS1 may be provided on the first peripheral region PR1. The first interlayered insulating layer ILD1 may be provided on the second peripheral region PR2. The substrate 100 may be formed of or include a semiconductor material (e.g., at least one of silicon (Si), germanium (Ge), silicon germanium (SiGe), gallium arsenide (GaAs), indium gallium arsenide (InGaAs), or aluminum gallium arsenide (AlGaAs)).

The first to fourth stack blocks STB1-STB4 may be provided on the cell block regions CBR of the substrate 100, respectively. The first stack block STB1 may be arranged in the first direction X on the top surface of the substrate 100 and may include first stacks ST1a and ST1 extending lengthwise in the second direction Y. The second stack block STB2 may be arranged in the first direction X on the top surface of the substrate 100 and may include second stacks ST2a and ST2 extending lengthwise in the second direction Y. The third stack block STB3 may be arranged in the first direction X on the top surface of the substrate 100 and may include third stacks ST3a and ST3 extending lengthwise in the second direction Y. The fourth stack block STB4 may be arranged in the first direction X on the top surface of the substrate 100 and may include fourth stacks ST4a and ST4 extending lengthwise in the second direction Y.

Each of the first to fourth stacks ST1a-ST4a and ST1-ST4 may include insulating patterns 330 and gate electrodes 320a, 320b, and 320c, which are alternately and repeatedly stacked on the substrate 100. The insulating patterns 330 may be stacked in the third direction Z. The insulating patterns 330 may be formed of or include, for example, a silicon oxide layer. Each of the gate electrodes 320a, 320b, and 320c may be provided between the insulating patterns 330, which are adjacent to each other in the third direction Z. The gate electrodes 320a, 320b, and 320c may include a ground selection gate electrode 320a, a plurality of cell gate electrodes 320b, and a string selection gate electrode 320c. The ground selection gate electrode 320a may be the lowermost electrode of the gate electrodes 320a, 320b, and 320c, and the string selection gate electrode 320c may be the uppermost electrode of the gate electrodes 320a, 320b, and 320c. The cell gate electrodes 320b may be provided between the ground selection gate electrode 320a and the string selection gate electrode 320c.

End portions of the first to fourth stacks ST1a-ST4a and ST1-ST4 in contact with the first interlayered insulating layer ILD1 may be provided to form a staircase structure STS. For example, a height of each of the first to fourth stacks ST1a-ST4a and ST1-ST4 may decrease with increasing distance from the first separation structure SRS1. For example, a length, in the second direction Y, of each of the gate electrodes 320a, 320b, and 320c may decrease incrementally with increasing distance from the substrate 100. As an example, in the staircase structure STS of each of the first to fourth stacks ST1a-ST4a and ST1-ST4, each of the gate electrodes 320a, 320b, and 320c may have an end portion. The end portion of each of the ground and cell gate electrodes 320a and 320b may be exposed by another gate electrode directly provided thereon. In certain embodiments, an opposite end portion of each of the first to fourth stacks ST1a-ST4a and ST1-ST4 in contact with the first separation structure SRS1 may have a wall structure. The stacks, which are included in the fifth to eighth stack blocks STB5, STB6, STB7, and STB8 of FIG. 3, may have the same stacking structure as the first to second stacks ST1a-ST4a and ST1-ST4.

The first interlayered insulating layer ILD1 may be provided on the second peripheral region PR2 of the substrate 100 to cover the staircase structures STS of the first to fourth stacks ST1a-ST4a and ST1-ST4. A top surface of the first interlayered insulating layer ILD1 may be located at the same level as top surfaces of the first to fourth stacks ST1a-ST4a and ST1-ST4. For example, the top surface of the first interlayered insulating layer ILD1 may be coplanar with uppermost surfaces of the first to fourth stacks ST1a-ST4a and ST1-ST4. The first interlayered insulating layer ILD1 may be formed of or include, for example, a silicon oxide layer.

Referring to FIGS. 4, 5 and 6, cell vertical channel structures CCS may be provided on the top surface of the substrate 100 to penetrate the first to fourth stacks ST1a-ST4a and ST1-ST4 in the third direction Z. The cell vertical channel structures CCS may be spaced apart from the staircase structures STS of the first to fourth stacks ST1a-ST4a and ST1-ST4. The cell vertical channel structures CCS may include vertical channel portions VC, semiconductor pillars SP, charge storing structures 340, gap-fill layers 350, and pads 360. The vertical channel portions VC may be provided to penetrate the first to fourth stacks ST1a-ST4a and ST1-ST4 in the third direction Z. With respect to a top down view, the vertical channel portions VC may be provided to form a zigzag or in-line arrangement in the first direction X. The vertical channel portions VC may have a hollow-pipe shape, a cylindrical shape, or a cup shape. Each of the vertical channel portions VC may include a single layer or a plurality of layers. The vertical channel portions VC may be formed of or may include, for example, at least one of a single crystalline silicon layer, an organic semiconductor layer, or nano-sized carbon structures.

The semiconductor pillars SP may be provided between the vertical channel portions VC and the substrate 100. The semiconductor pillars SP may be provided on the top surface of the substrate 100 to penetrate the ground selection gate electrode 320a in the third direction Z. The semiconductor pillars SP may be in contact with the vertical channel portions VC, respectively. For example, a top surface of each of the semiconductor pillars SP may contact a lower portion or surface of each of the vertical channel portions VC. The semiconductor pillars SP may be formed of a semiconductor layer, whose conductivity type is the same as that of the substrate 100 or intrinsic. The charge storing structures 340 may be provided between the vertical channel portions VC and the gate electrodes 320a, 320b, and 320c. The charge storing structures 340 may extend along outer sidewalls of the vertical channel portions VC and in the third direction Z. For example, each of the charge storing structures 340 may have a shape enclosing an outer sidewall of the vertical channel portion VC. The charge storing structures 340 may be formed of or include, for example, at least one of a silicon oxide layer, a silicon nitride layer, a silicon oxynitride layer, and high-k dielectric layers and may have a single or multi-layered structure.

As shown in FIG. 7, each of the charge storing structures 340 may include a tunnel insulating layer TL, a blocking insulating layer BLL, and a charge storing layer CTL. The tunnel insulating layer TL may be provided adjacent to each of the vertical channel portions VC to enclose an outer sidewall of the vertical channel portion VC. The blocking insulating layer BLL may be provided adjacent to the gate electrodes 320a, 320b, and 320c. The charge storing layer CTL may be provided between the tunnel insulating layer TL and the blocking insulating layer BLL. The tunnel insulating layer TL may be formed of or include, for example, at least one of silicon oxide or high-k dielectric materials (e.g., aluminum oxide ($Al_2O_3$) and hafnium oxide ($HfO_2$)). The blocking insulating layer BLL may be formed of or may include, for example, at least one of silicon oxide or high-k dielectric materials (e.g., aluminum oxide ($Al_2O_3$) and hafnium oxide ($HfO_2$)). The charge storing layer CTL may be formed of or include, for example, silicon nitride.

The gap-fill layers 350 may be provided in internal spaces defined by the vertical channel portions VC. The gap-fill layers 350 may be formed, for example, at least one of silicon oxide, silicon nitride, or silicon oxynitride. The pads 360 may be provided on the vertical channel portions VC, the charge storing structures 340, and the gap-fill layers 350. The pads 360 may be formed of or include, for example, at least one of conductive materials or semiconductor materials, which are doped to have a conductivity type different from that of the vertical channel portions VC.

A gate insulating layer 370 may be provided between each of the semiconductor pillars SP and the ground selection gate electrode 320a. The gate insulating layer 370 may have side surfaces, each of which has an outwardly curved shape. For example, when viewed in cross-section, the gate insulating layer 370 may have an elliptical shape with the long axis aligned in the vertical direction and the short axis aligned with a middle line of the adjacent ground selection gate electrode 320a. The gate insulating layer 370 may be formed of or may include, for example, an oxide layer formed by a thermal oxidation process.

Dummy channel structures DVS may be provided on the top surface of the substrate 100 to penetrate the staircase structures STS of the first to fourth stacks ST1a-ST4a and ST1-ST4. The dummy channel structures DVS may penetrate the end portions of the gate electrodes 320a, 320b, and 320c. The dummy channel structures DVS may have substantially the same structure as the cell vertical channel structures CCS. The structure of the dummy channel structures DVS will be described in more detail with reference to FIGS. 11 and 12.

A horizontal insulating layer 380 may be provided between the charge storing structures 340 and the gate electrodes 320a, 320b, and 320c and may be extended to cover top and bottom surfaces of the gate electrodes 320a, 320b, and 320c. The horizontal insulating layer 380 may be formed of or may include, for example, at least one of silicon oxide (e.g., $SiO_2$) or high-k dielectric materials (e.g., aluminum oxide ($Al_2O_3$) and hafnium oxide ($HfO_2$)).

The first separation structure SRS1 may be provided on the top surface of the substrate 100 to be interposed between the first stack ST1a and the second stack ST2a, which are closest to each other in the first direction X among the first and second stack blocks STB1 and STB2. The first separation structure SRS1 may also be extended in the first direction X to be interposed between the first stacks ST1 and ST1a and the third stacks ST3 and ST3a facing each other in the second direction Y. The first separation structure SRS1 may also be extended in the first direction X to be interposed between the second stacks ST2 and ST2a and the fourth stacks ST4 and ST4a facing each other in the second direction Y. In addition, the first separation structure SRS1 may be extended in the second direction Y to be interposed between the third stack ST3a and the fourth stack ST4a, which are closest to each other in the first direction X among the third and fourth stack blocks STB3 and STB4. First side surfaces SS1 of the first to fourth stacks ST1a-ST4a and ST1-ST4, which are parallel to the first direction X, may be in contact with the first separation structure SRS1. A top surface of the first separation structure SRS1 may be located at the same level as the top surfaces of the first to fourth stacks ST1a-ST4a and ST1-ST4 and the top surface of the first interlayered insulating layer ILD1. For example, top surfaces of the first separation structure SRS1, the first to fourth stacks ST1a-ST4a and ST1-ST4, and the first interlayered insulating layer ILD1 may be coplanar with one another.

The first separation structure SRS1 may include a mold structure MS and first to fourth separation layers SL1, SL2, SL3, and SL4. The mold structure MS may include first mold layers M1, which are stacked in the third direction Z, and second mold layers M2, which are respectively interposed between the first mold layers M1. Each of the second mold layers M2 may be provided between an adjacent pair of the first mold layers M1, which are adjacent to each other in the third direction Z. Each of the first mold layers M1 may be located at the same level as a corresponding one of the insulating patterns 330, and each of the second mold layers M2 may be located at the same level as a corresponding one of the gate electrodes 320a, 320b, 320c. The first mold layers M1 may include a material having an etch selectivity with respect to the second mold layers M2. For example, the first mold layers M1 may be formed of or may include a silicon oxide layer, and the second mold layers M2 may be formed of or may include a silicon nitride layer.

The first separation layer SL1 may be provided between the mold structure MS and the first stack ST1a, which is closest to the first separation structure SRS1 among the first stacks ST1 and ST1a, and may be further extended in the first direction X to be interposed between the mold structure MS and the first side surfaces SS1 of the first stacks ST1a and ST1. The first separation layer SL1 may be in contact with the first side surfaces SS1 of the first stacks ST1a and ST1. Each of the first side surfaces SS1 of the first stacks ST1a and ST1 may be a flat surface that is perpendicular to the top surface of the substrate 100 or is parallel to the third direction Z. The second separation layer SL2 may be provided between the mold structure MS and the second stack ST2a, which is closest to the first separation structure SRS1 among the second stacks ST2 and ST2a, and may be further extended in the first direction X to be interposed between the mold structure MS and the first side surfaces SS1 of the second stacks ST2a and ST2. The second separation layer SL2 may be in contact with the first side surfaces SS1 of the second stacks ST2a and ST2. Each of the first side surfaces SS1 of the second stacks ST2a and ST2 may be a flat surface that is perpendicular to the top surface of the substrate 100 or is parallel to the third direction Z.

The third separation layer SL3 may be provided between the mold structure MS and the third stack ST3a, which is closest to the first separation structure SRS1 among the third stacks ST3 and ST3a, and may be further extended in the first direction X to be interposed between the mold structure MS and the first side surfaces SS1 of the third stacks ST3a and ST3. The third separation layer SL3 may be in contact with the first side surfaces SS1 of the third stacks ST3*a* and ST3. Each of the first side surfaces SS1 of the third stacks ST3*a* and ST3 may be a flat surface that is perpendicular to the top surface of the substrate 100 or is parallel to the third direction Z. The fourth separation layer SL4 may be provided between the mold structure MS and the fourth stack ST4*a*, which is closest to the first separation structure SRS1 among the fourth stacks ST4 and ST4*a*, and may be further extended in the first direction X to be interposed between the mold structure MS and the first side surfaces SS1 of the fourth stacks ST4*a* and ST4. The fourth separation layer SL4 may be in contact with the first side surfaces SS1 of the fourth stacks ST4*a* and ST4. Each of the first side surfaces SS1 of the fourth stacks ST4*a* and ST4 may be a flat surface that is perpendicular to the top surface of the substrate 100 or is parallel to the third direction Z. The first to fourth separation layers SL1-SL4 may consist of a single layer. The first to fourth separation layers SL1-SL4 may be formed of or may include, for example, a silicon oxide layer.

In some embodiments, a width W1 of the mold structure MS in the first direction X and a width W1' of the mold structure MS in the second direction Y may be substantially equal to a width W2 of each of the first to fourth stacks ST1*a*-ST4*a* and ST1-ST4 in the first direction X (i.e., W1=W2 and W1'=W2). In certain embodiments, the width W1 of the mold structure MS in the first direction X and the width W1' of the mold structure MS in the second direction Y may be different from the width W2 of each of the first to fourth stacks ST1*a*-ST4*a* and ST1-ST4 in the first direction X (i.e., W1≠W2 and W1'≠W2).

A second interlayered insulating layer ILD2 may cover the top surfaces of the first to fourth stacks ST1*a*-ST4*a* and ST1-ST4, the top surface of the first interlayered insulating layer ILD1, and the top surface of the first separation structure SRS1. The second interlayered insulating layer ILD2 may include, for example, a silicon oxide layer.

First to fourth contact structures 400*a*, 400*b*, 400*c*, and 400*d* on the top surface of the substrate 100 may be extended in the third direction Z to penetrate the second interlayered insulating layer ILD2. The first contact structures 400*a* may be extended lengthwise in the second direction Y between adjacent ones of the first stacks ST1 and ST1*a* and between the first stack ST1*a* and the first separation structure SRS1. The second contact structures 400*b* may be extended lengthwise in the second direction Y between adjacent ones of the second stacks ST2 and ST2*a* and between the second stack ST2*a* and the first separation structure SRS1. The third contact structures 400*c* may be extended lengthwise in the second direction Y between adjacent ones of the third stacks ST3 and ST3*a* and between the third stack ST3*a* and the first separation structure SRS1. The fourth contact structures 400*d* may be extended lengthwise in the second direction Y between adjacent ones of the fourth stacks ST4 and ST4*a* and between the fourth stack ST4*a* and the first separation structure SRS1. The first to fourth contact structures 400*a*, 400*b*, 400*c*, and 400*d* may be in contact with the first separation structure SRS1.

In some embodiments, each of second side surfaces SS2 of the first stack ST1*a*, the second stack ST2*a*, the third stack ST3*a*, and the fourth stack ST4*a*, which are adjacent to the first separation structure SRS1, may be a flat surface that is perpendicular to the top surface of the substrate 100. The second side surfaces SS2 of the first to fourth stacks ST1*a*-ST4*a* may be parallel to the second direction Y. In some embodiments, first to fourth contact structures 400*a*, 400*b*, 400*c*, and 400*d* may be provided between the first separation structure SRS1 and the first to fourth stacks ST1*a*-ST4*a*, respectively. Each of the first to fourth contact structures 400*a*, 400*b*, 400*c*, and 400*d* may be in contact with a corresponding one of the first to fourth separation layers SL1, SL2, SL3, and SL4 of the first separation structure SRS1 and may be spaced apart from the mold structure MS of the first separation structure SRS1. Top surfaces of the first to fourth contact structures 400*a*, 400*b*, 400*c*, and 400*d* may be coplanar with a top surface of the second interlayered insulating layer ILD2.

Each of the first to fourth contact structures 400*a*, 400*b*, 400*c*, and 400*d* may include a spacer 420 and a common source contact 410. The common source contact 410 may be formed of or may include, for example, at least one of metallic materials (e.g., tungsten, copper, and aluminum) or transition metals (e.g., titanium and tantalum). The spacer 420 may be provided to cover a side surface of the common source contact 410 or enclose the common source contact 410. The spacer 420 may be formed of or include, for example, at least one of insulating materials (e.g., silicon oxide and silicon nitride).

Common source regions CSR may be provided in the substrate 100 to be overlapped with the first to fourth contact structures 400*a*, 400*b*, 400*c*, and 400*d*. The common source regions CSR may be electrically connected to the common source contacts 410 of the first to fourth contact structures 400*a*, 400*b*, 400*c*, and 400*d*. The common source regions CSR may have a conductivity type different from that of the substrate 100.

A third interlayered insulating layer ILD3 may be provided on the second interlayered insulating layer ILD2. The third interlayered insulating layer ILD3 may cover a top surface of the second interlayered insulating layer ILD2 and top surfaces of the first to fourth contact structures 400*a*, 400*b*, 400*c*, and 400*d*. The third interlayered insulating layer ILD3 may be formed of or include, for example, a silicon oxide layer.

Channel contact plugs CCP may be provided on the pads 360. The channel contact plugs CCP may be provided to penetrate the third interlayered insulating layer ILD3 and the second interlayered insulating layer ILD2 in the third direction Z and may be connected to the pads 360. For example, the channel contact plugs CCP may contact and be electrically connected to the pads 360. The channel contact plugs CCP may be formed of or include, for example, at least one of metallic materials (e.g., copper and tungsten) or metal nitrides (e.g., TiN, TaN, and WN).

Cell contact plugs 510 may be provided on the staircase structures STS of the first to fourth stacks ST1*a*-ST4*a* and ST1-ST4. For example, the cell contact plugs 510 may be provided on the end portions of the gate electrodes 320*a*, 320*b*, and 320*c*. The cell contact plugs 510 may be connected to the gate electrodes 320*a*, 320*b*, and 320*c*. The cell contact plugs 510 may be formed of or may include, for example, at least one of metallic materials (e.g., copper and tungsten) or metal nitrides (e.g., TiN, TaN, and WN).

First peripheral contact plugs PCP1 may be provided in the first separation structure SRS1. For example, the first peripheral contact plugs PCP1 may be provided to penetrate the third interlayered insulating layer ILD3, the second interlayered insulating layer ILD2, the mold structure MS, and the substrate 100 in the third direction Z and may be connected to the interconnection pads 213 of the peripheral circuit structure PRS. The first peripheral contact plugs PCP1 may be connected to the transistors TR of the peripheral circuit structure PRS. Second peripheral contact plugs PCP2 may be provided on the second peripheral region PR2 of the substrate 100. The second peripheral contact plugs PCP2 may be provided to penetrate the third interlayered insulating layer ILD3, the second interlayered insulating layer ILD2, the first interlayered insulating layer ILD1, and the substrate 100 in the third direction Z and may be connected to the interconnection pads 213. The second peripheral contact plugs PCP2 may be connected to the transistors TR of the peripheral circuit structure PRS.

Although not shown, an insulating layer may be disposed between each of the first peripheral contact plugs PCP1 and the substrate 100 and disposed between each of the second peripheral contact plugs PCP2 and the substrate 100, insulating the first peripheral contact plugs PCP1 and the second peripheral contact plugs PCP2 from the substrate 100. The each of the first peripheral contact plugs PCP1 and the each of the second peripheral contact plugs PCP2 may be spaced apart from the substrate 100 by the insulating layer. Interconnection lines ICN may be provided on the third interlayered insulating layer ILD3. For example, bottom surface of the interconnection lines ICN may contact a top surface of the third interlayered insulating layer ILD3. The interconnection lines ICN may be connected to the cell contact plugs 510, the first peripheral contact plugs PCP1, and the second peripheral contact plugs PCP2. Bit lines BL1 and BL2 may be provided on the third interlayered insulating layer ILD3. For example, bottom surfaces of the bit lines BL1 and BL2 may contact a top surface of the third interlayered insulating layer ILD3. The bit lines BL1 and BL2 may include first bit lines BL1 crossing the first stacks ST1 and ST1a, second bit lines BL2 crossing the second stacks ST2 and ST2a, third bit lines (not shown), crossing the third stacks ST3 and ST3a, and fourth bit lines (not shown) crossing the fourth stacks ST4 and ST4a. The first to fourth bit lines BL1 and BL2 may be extended lengthwise in the first direction X and may be spaced apart from each other in the second direction Y.

The first and second bit lines BL1 and BL2 facing each other in the first direction X may be aligned with each other and may be spaced apart from each other. In other words, the first and second bit lines BL1 and BL2 may not be electrically connected to each other. The third and fourth bit lines facing each other in the first direction X may be aligned to each other and may be spaced apart from each other. In other words, the third and fourth bit lines may not be electrically connected to each other.

Figure 8:
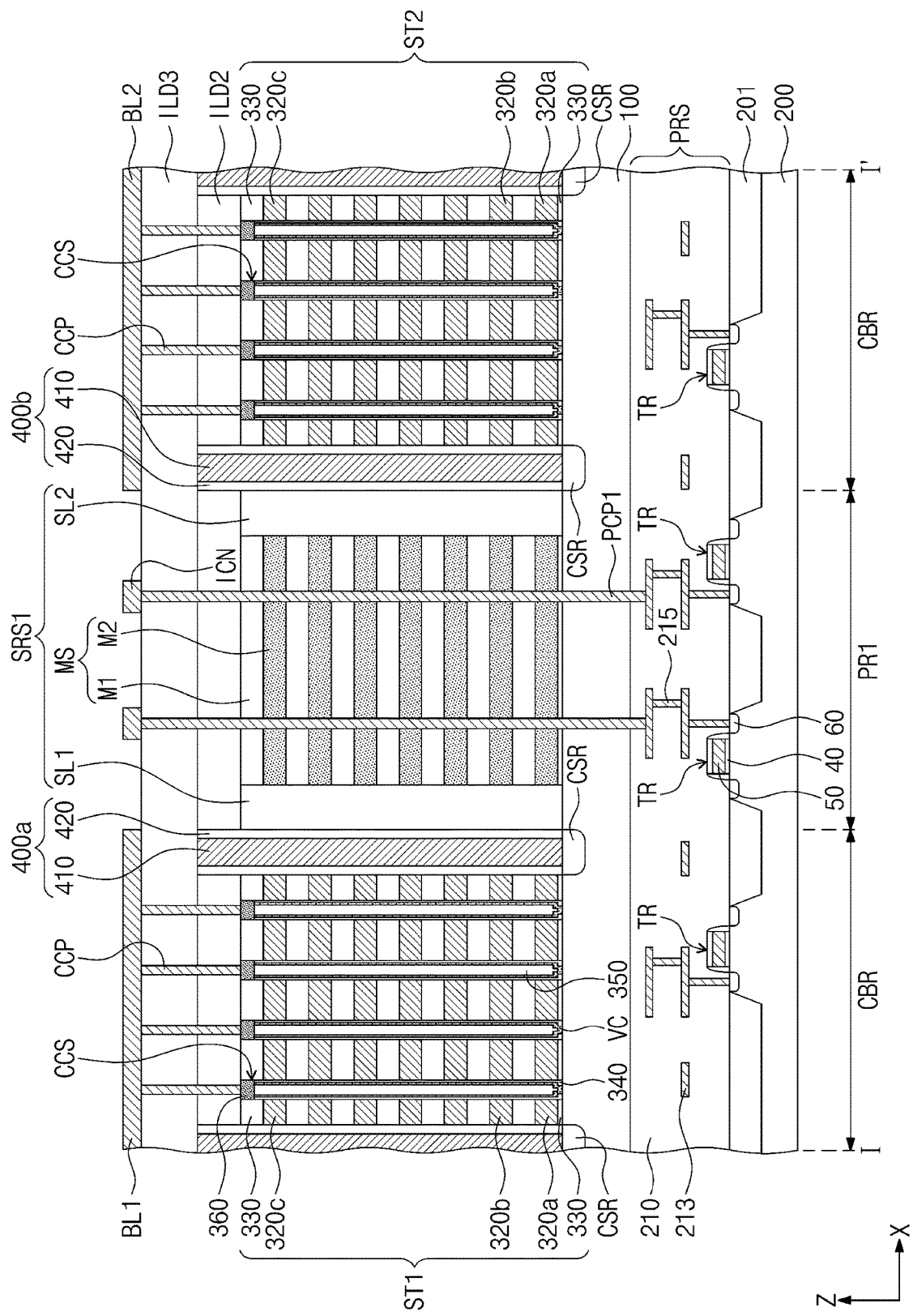
FIG. 8 is a sectional view, which is taken along line I-I' of FIG. 4, to illustrate a three-dimensional semiconductor memory device according to example embodiments.

FIG. 8 is a sectional view, which is taken along line I-I' of FIG. 4 to illustrate a three-dimensional semiconductor memory device according to example embodiments.

Referring to FIG. 8, the vertical channel portions VC and the charge storing structures 340 may be in contact with the top surface of the substrate 100. That is, the semiconductor pillars SP and the gate insulating layers 370 described with reference to FIGS. 3 to 7 may be omitted from the three-dimensional semiconductor memory device according to the present embodiment.

Figure 9:
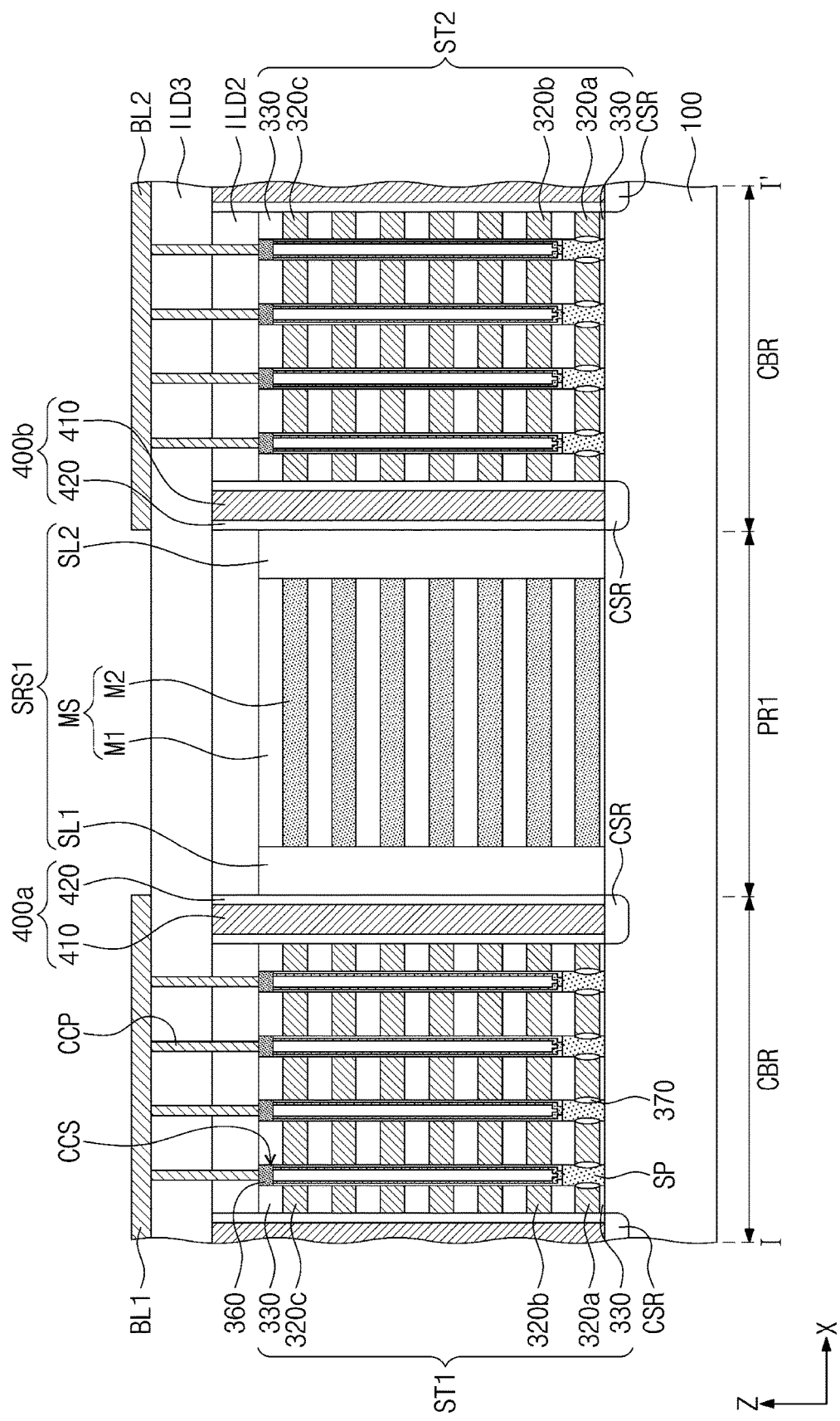
FIG. 9 is a sectional view, which is taken along line I-I' of FIG. 4, to illustrate a three-dimensional semiconductor memory device according to example embodiments.
Figure 10:
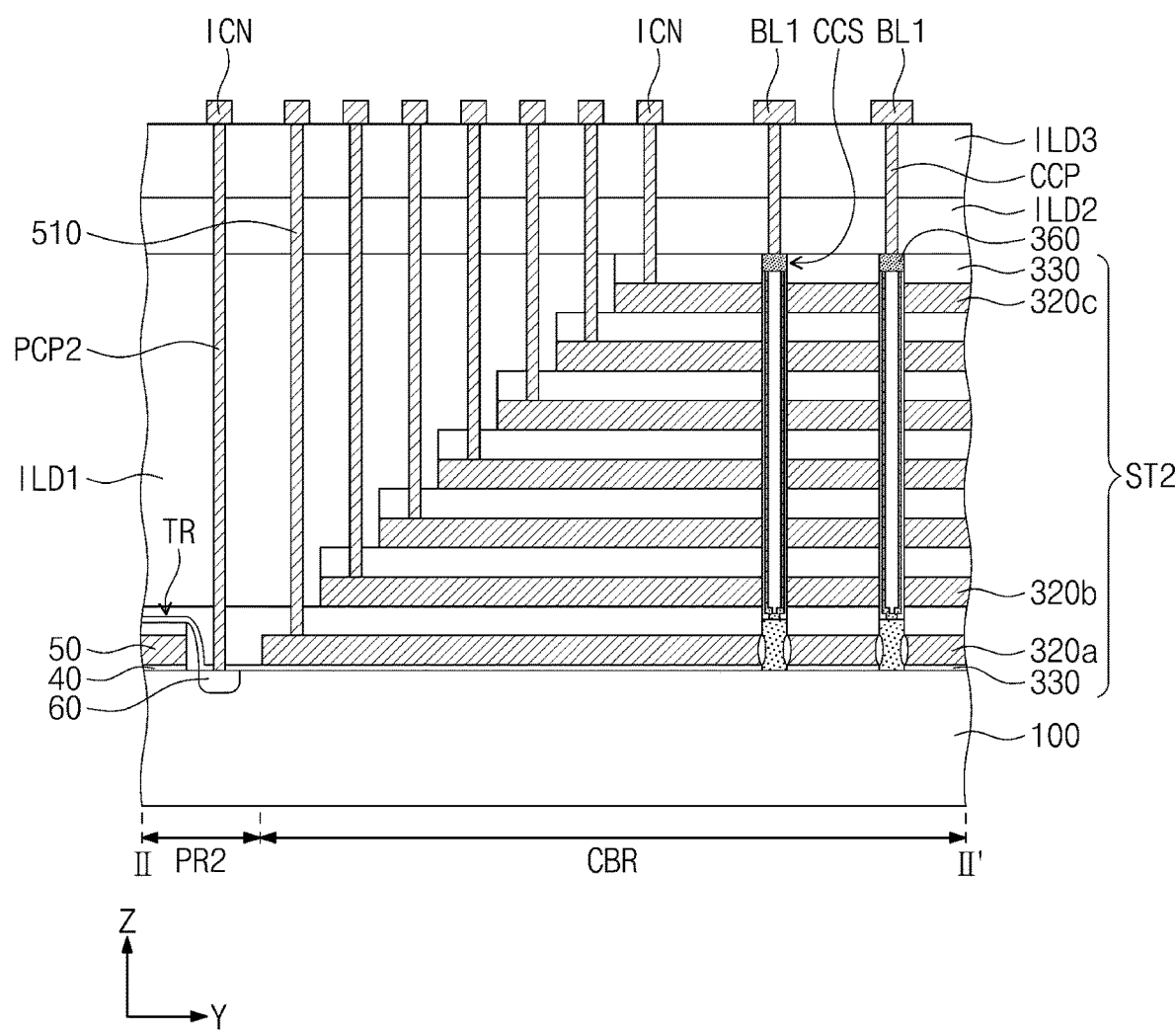
FIG. 10 is a sectional view, which is taken along line II-II' of FIG. 4, to illustrate a three-dimensional semiconductor memory device according to example embodiments.

FIG. 9 is a sectional view, which is taken along line I-I' of FIG. 4 to illustrate a three-dimensional semiconductor memory device according to example embodiments of the inventive concept. FIG. 10 is a sectional view, which is taken along line II-II' of FIG. 4 to illustrate a three-dimensional semiconductor memory device according to example embodiments.

Referring to FIGS. 9 and 10, a transistor TR may be provided on the second peripheral region PR2 of the substrate 100. The transistor TR may be covered with the insulating pattern 330, which is provided between the ground selection gate electrode 320a and the lowermost cell gate electrode 320b and is extended onto the top surface of the second peripheral region PR2 of the substrate 100. That is, in some embodiments, the lower substrate 200 and the peripheral circuit structure PRS may be omitted. The first peripheral contact plugs PCP1 may not be provided in the first separation structure SRS1. Furthermore, the second peripheral contact plug PCP2 may be provided to penetrate the third to first interlayered insulating layers ILD1, ILD2, and ILD3 and the insulating pattern 330, which is provided between the ground selection gate electrode 320a and the lowermost cell gate electrode 320b, and may be electrically connected to the source/drain regions 60 provided in the substrate 100.

Figure 11:
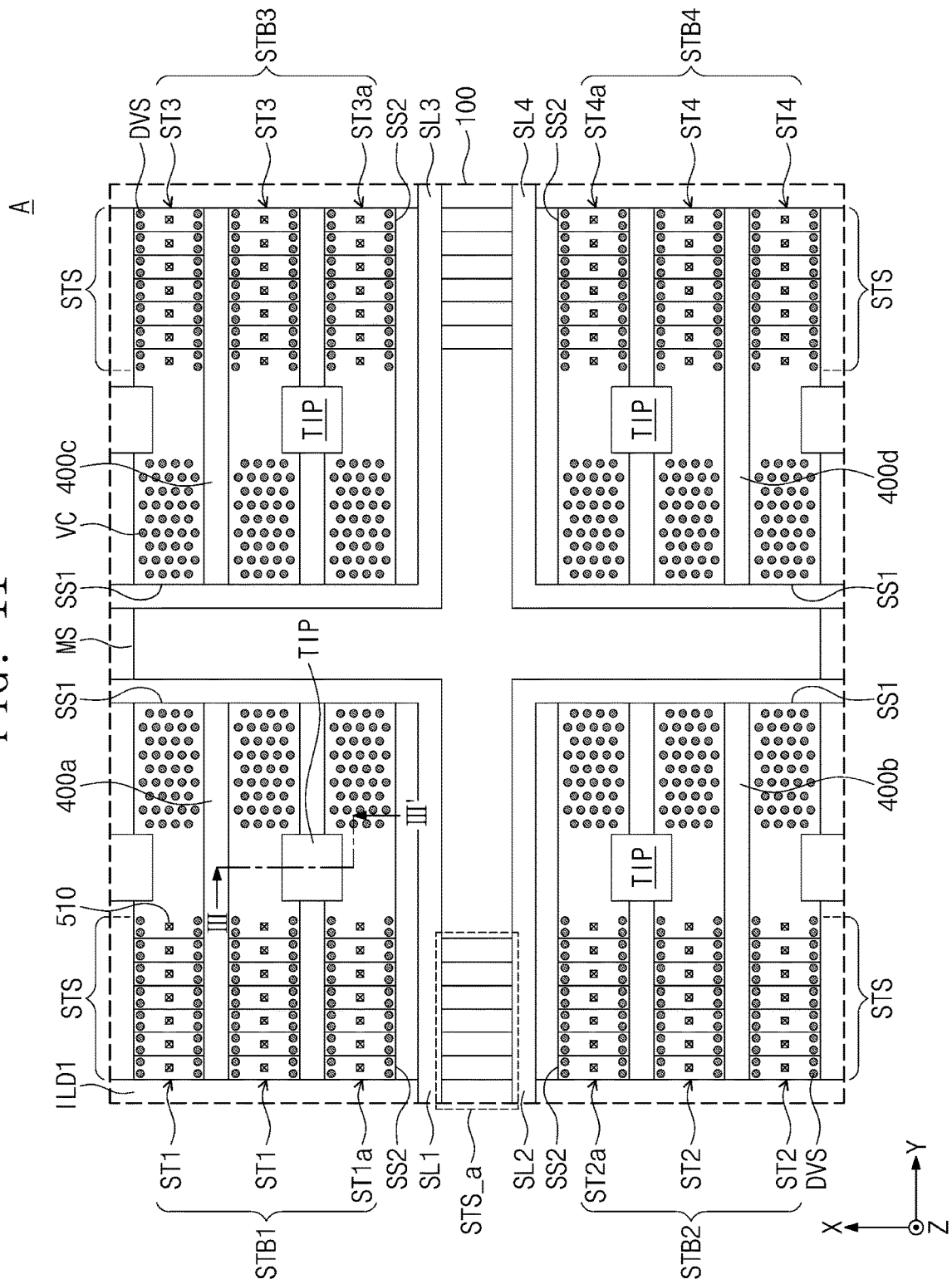
FIG. 11 is an enlarged plan view illustrating the portion 'A' of FIG. 3.
Figure 12:
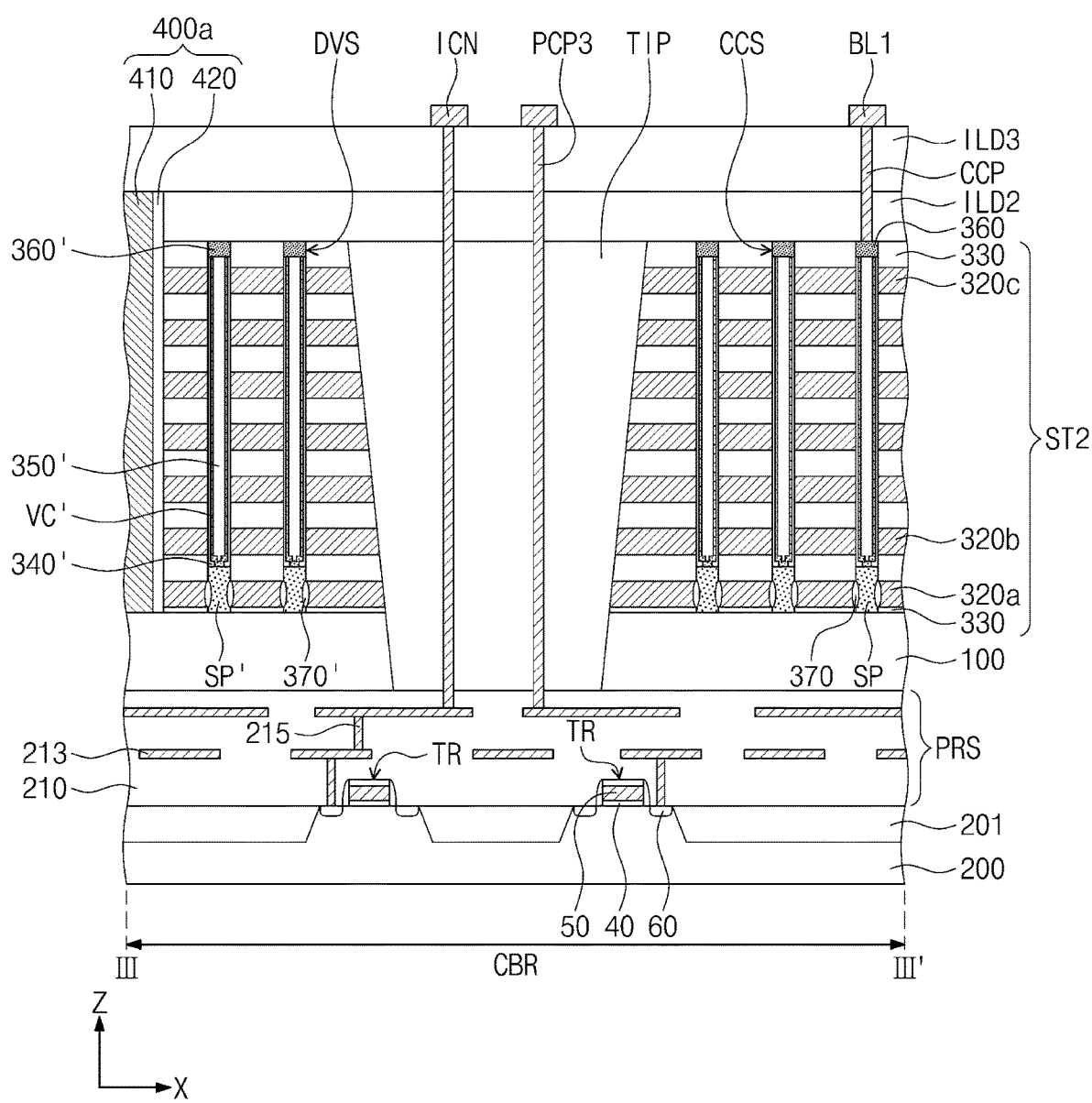
FIG. 12 is a sectional view, which is taken along line of FIG. 11, to illustrate a three-dimensional semiconductor memory device according to example embodiments.

FIG. 11 is an enlarged plan view illustrating the portion 'A' of FIG. 3. FIG. 12 is a sectional view, which is taken along line III-III' of FIG. 11 to illustrate a three-dimensional semiconductor memory device according to example embodiments. For concise description, an element described with reference to FIGS. 3 to 7 may be identified by the same reference number without repeating an overlapping description thereof.

Referring to FIGS. 11 and 12, through insulating patterns TIP may be provided to penetrate, in the third direction Z, an adjacent pair of the first stacks ST1 and ST1a, an adjacent pair of the second stacks ST2 and ST2a, an adjacent pair of the third stacks ST3 and ST3a, and an adjacent pair of the fourth stacks ST4 and ST4a, which are adjacent to each other in the first direction X. The through insulating patterns TIP may penetrate the substrate 100 and may be in contact with a top surface of the peripheral circuit structure PRS. When viewed in a plan view, each of the through insulating patterns TIP may be provided between the cell contact plug 510, which is connected to the string selection gate electrode 320c, and the vertical channel portions VC. Side surfaces of the through insulating patterns TIP may be inclined at an angle with respect to the top surface of the substrate 100. The through insulating patterns TIP may be formed of or may include, for example, high-density plasma (HDP) oxide, tetraethylorthosilicate (TEOS), plasma-enhanced tetraethylorthosilicate (PE-TEOS), O3-tetra ethyl ortho silicate (O3-TEOS), undoped silicate glass (USG), phosphosilicate glass (PSG), borosilicate glass (BSG), borophosphosilicate glass (BPSG), fluoride silicate glass (FSG), spin on glass (SOG), tonen silazene (TOSZ), or any combination thereof.

Although not shown, the dummy channel structures DVS may be provided to enclose the through insulating patterns TIP and to penetrate the first to fourth stacks ST1a-ST4a and ST1-ST4 in the third direction Z. Each of the dummy channel structures DVS may include a dummy semiconductor pillar SP', a dummy vertical channel portion VC', a dummy charge storing structure 340', a dummy gap-fill layer 350', and dummy pads 360'. The channel contact plugs CCP may not be provided on top surfaces of the pads 360' of the dummy channel structures DVS. Furthermore, a dummy gate insulating layer 370' may be provided between the dummy semiconductor pillar SP' and the ground selection gate electrode 320a.

Third peripheral contact plugs PCP3 may be provided to penetrate the through insulating patterns TIP and the substrate 100 and may be connected to the interconnection pads 213 of the peripheral circuit structure PRS. The third peripheral contact plugs PCP3 may be connected to the interconnection lines ICN provided on a top surface of the third interlayered insulating layer ILD3.

Figure 13:
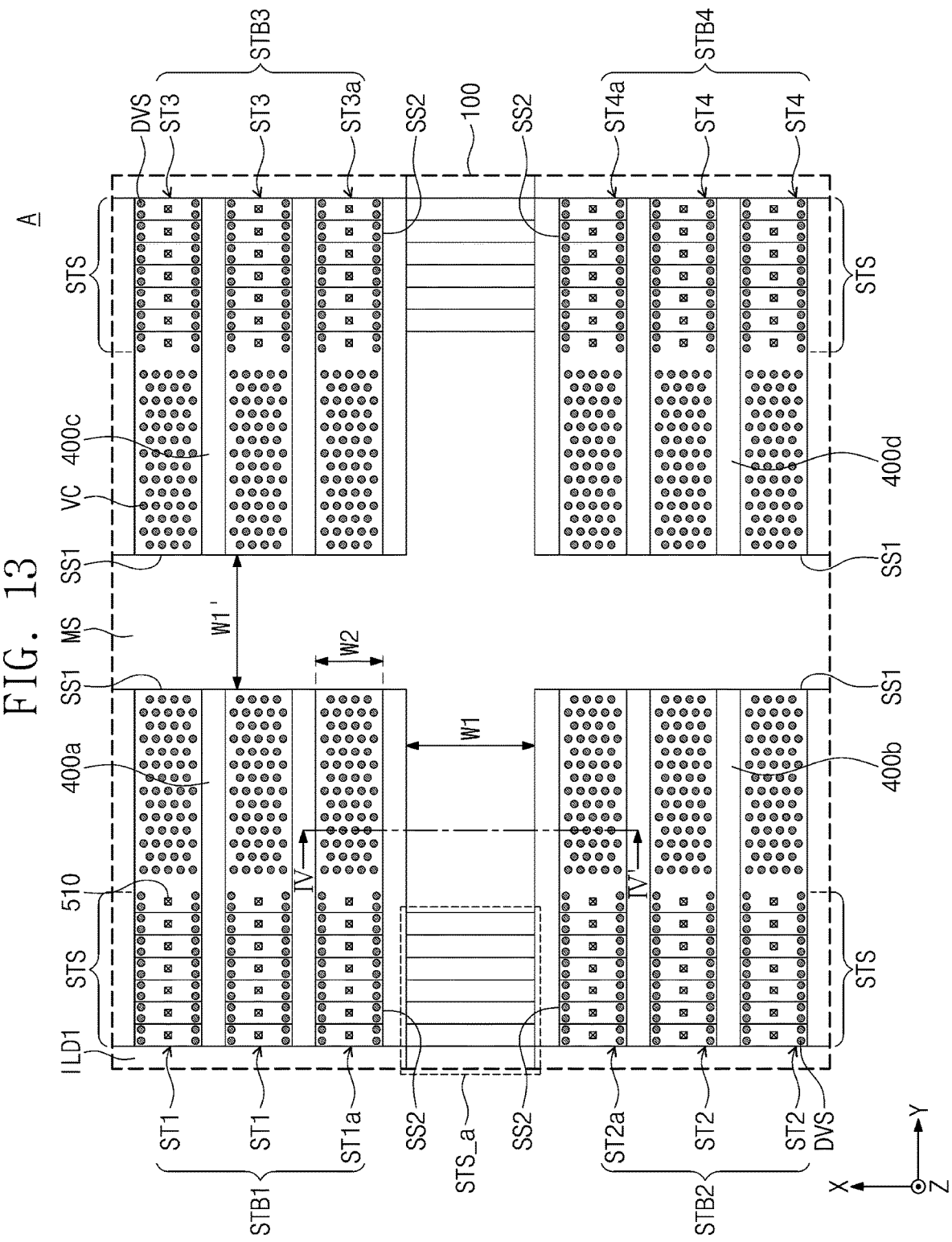
FIG. 13 is an enlarged plan view illustrating the portion 'A' of FIG. 3.
Figure 14:
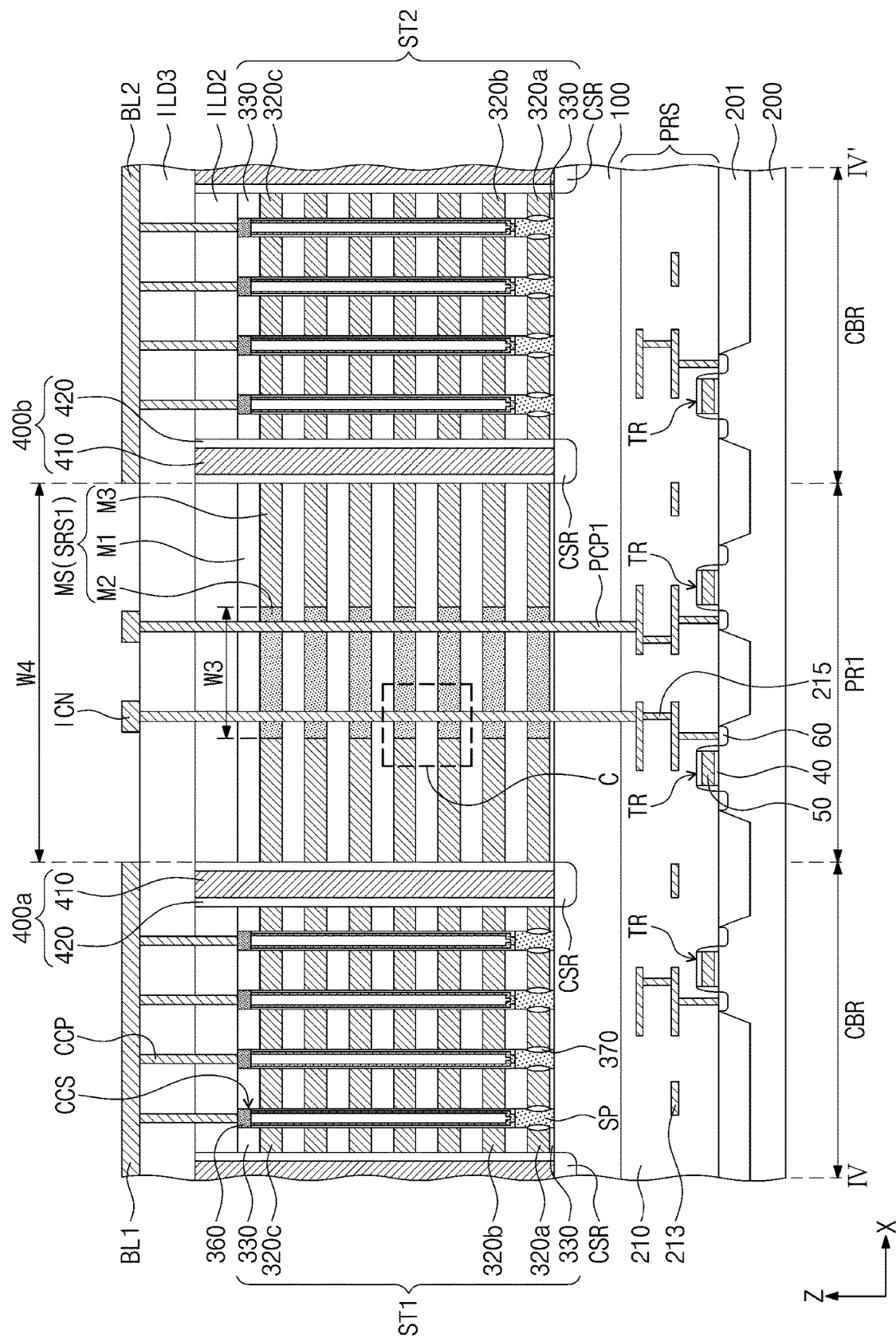
FIG. 14 is a sectional view, which is taken along line IV-IV' of FIG. 13, to illustrate a three-dimensional semiconductor memory device according to example embodiments.
Figure 15:
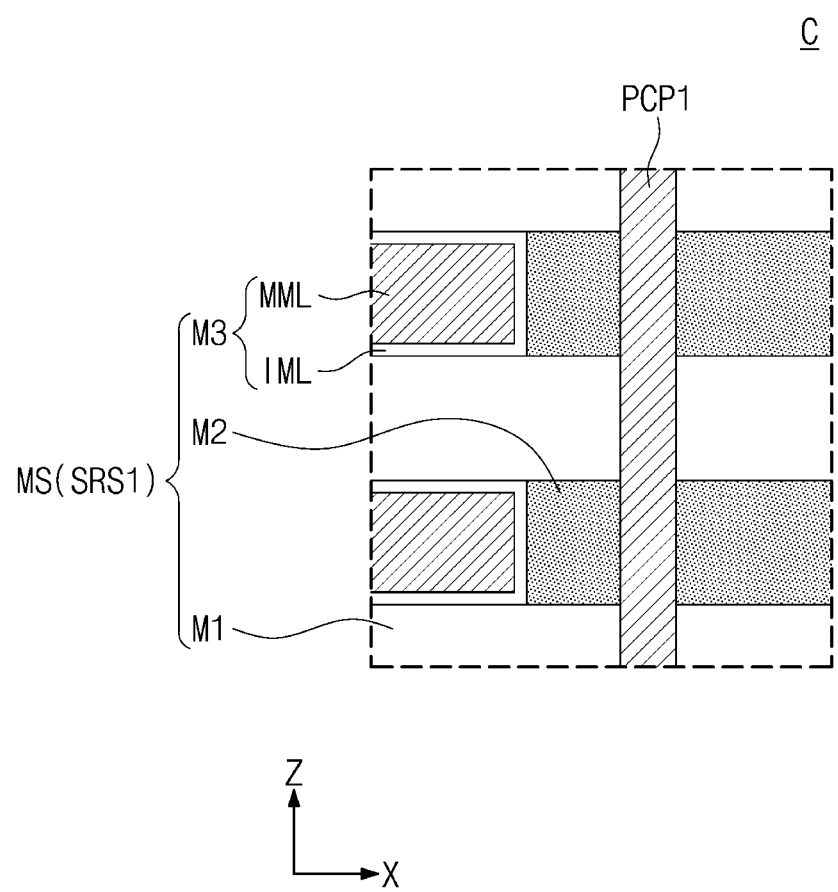
FIG. 15 is an enlarged sectional view illustrating a portion 'C' of FIG. 14.

FIG. 13 is an enlarged plan view illustrating the portion 'A' of FIG. 3. FIG. 14 is a sectional view, which is taken along line IV-IV' of FIG. 13 to illustrate a three-dimensional semiconductor memory device according to example embodiments. FIG. 15 is an enlarged sectional view illustrating a portion 'C' of FIG. 14. For concise description, an element described with reference to FIGS. 3 to 7 may be identified by the same reference number without repeating an overlapping description thereof.

Referring to FIGS. 13 to 15, the first contact structure 400a between the first stack ST1a and the first separation structure SRS1, the second contact structure 400b between the second stack ST2a and the first separation structure SRS1, the third contact structure 400c between the third stack ST3a and the first separation structure SRS1, and the fourth contact structure 400d between the fourth stack ST4a and the first separation structure SRS1 may be in direct contact with the mold structure MS of the first separation structure SRS1. For example, in some embodiments, the first to fourth separation layers SL1-SL4 of the first separation structure SRS1 may be omitted. The first separation structure SRS1 may include first mold layers M1, which are stacked in the third direction Z on the substrate 100, and second mold layers M2 and third mold layers M3, which are interposed between the first mold layers M1 adjacent to each other in the third direction Z. Side surfaces of the second mold layers M2 may be horizontally recessed from side surfaces of the first mold layers M1. For example, widths W3 of the second mold layers M2 in the first direction X may be smaller than widths W4 of the first mold layers M1 in the first direction X (i.e., W3<W4). A sum of the widths W3 of the second mold layers M2 in the first direction X and a width of the third mold layer M3 in the first direction X disposed at the same level from the top surface of the substrate may be equal to widths W4 of the first mold layers M1 in the first direction X.

In a region between the first mold layers M1 adjacent to each other in the third direction Z, the third mold layers M3 may be spaced apart from each other by each of the second mold layers M2 interposed therebetween. The third mold layers M3 may have side surfaces that are in contact with the second mold layers M2. The third mold layers M3 may also have opposite side surfaces that are vertically aligned to the side surfaces of the first mold layers M1. Each of the third mold layers M3 may include an insulating mold layer IML and a metal mold layer MML. The metal mold layer MML may be placed between the first mold layers M1 that are adjacent to each other in the third direction Z. The insulating mold layer IML may be provided between the metal mold layer MML and the second mold layer M2 and may be horizontally extended to cover top and bottom surfaces of the metal mold layer MML. For example, the insulating mold layer IML may have vertical components that cover the side surfaces of the metal mold layer MML and horizontal components that cover top and bottom surfaces of the metal mold layer MML. The insulating mold layer IML may be formed of or may include the same material as the horizontal insulating layer 380 (e.g., see FIG. 7). The metal mold layer MML may be formed of or may include the same material as the gate electrodes 320a, 320b, and 320c. The first peripheral contact plugs PCP1 in the mold structure MS may be provided to penetrate the first and second mold layers M1 and M2 and may be spaced apart from the third mold layers M3. For example, the first peripheral contact plugs PCP1 may be provided between horizontally adjacent ones of the third mold layers M3.

The mold structure MS may be in contact with the first to fourth stacks ST1a-ST4a and ST1-ST4. For example, the first to fourth stacks ST1a-ST4a and ST1-ST4 may be in contact with the first mold layers M1 and the third mold layers M3 of the mold structure MS. The first to fourth stacks ST1a-ST4a and ST1-ST4 may be spaced apart from the second mold layers M2 of the mold structure MS. In some embodiments, the width W1 of the mold structure MS in the first direction X and the width W1' of the mold structure MS in the second direction Y may be larger than the widths W2 of the first to fourth stacks ST1a-ST4a and ST1-ST4 in the first direction X (e.g., W1>W2 and W1'>W2).

Figure 16:
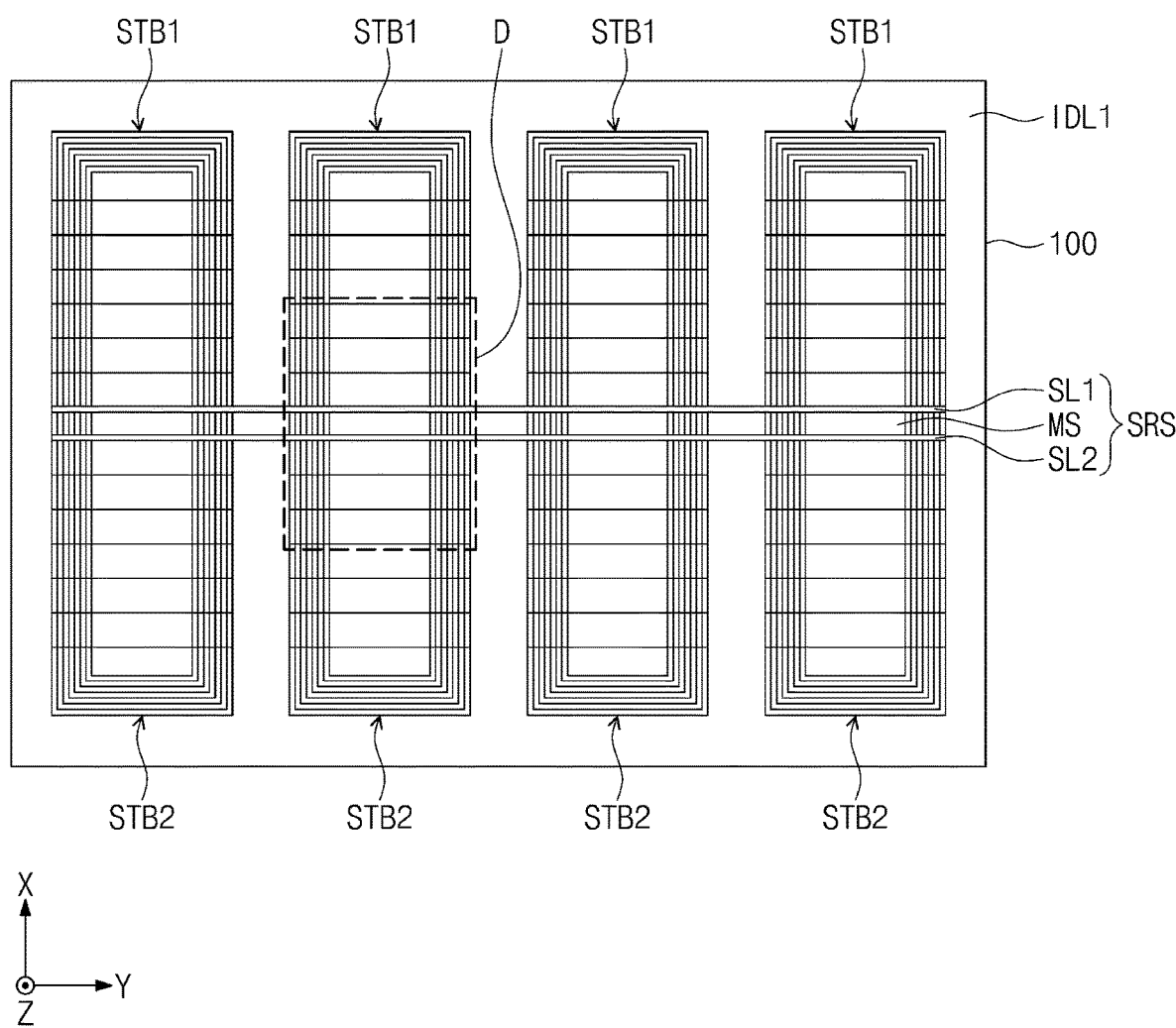
FIG. 16 is an enlarged plan view illustrating a semiconductor chip of FIG. 2.
Figure 17:
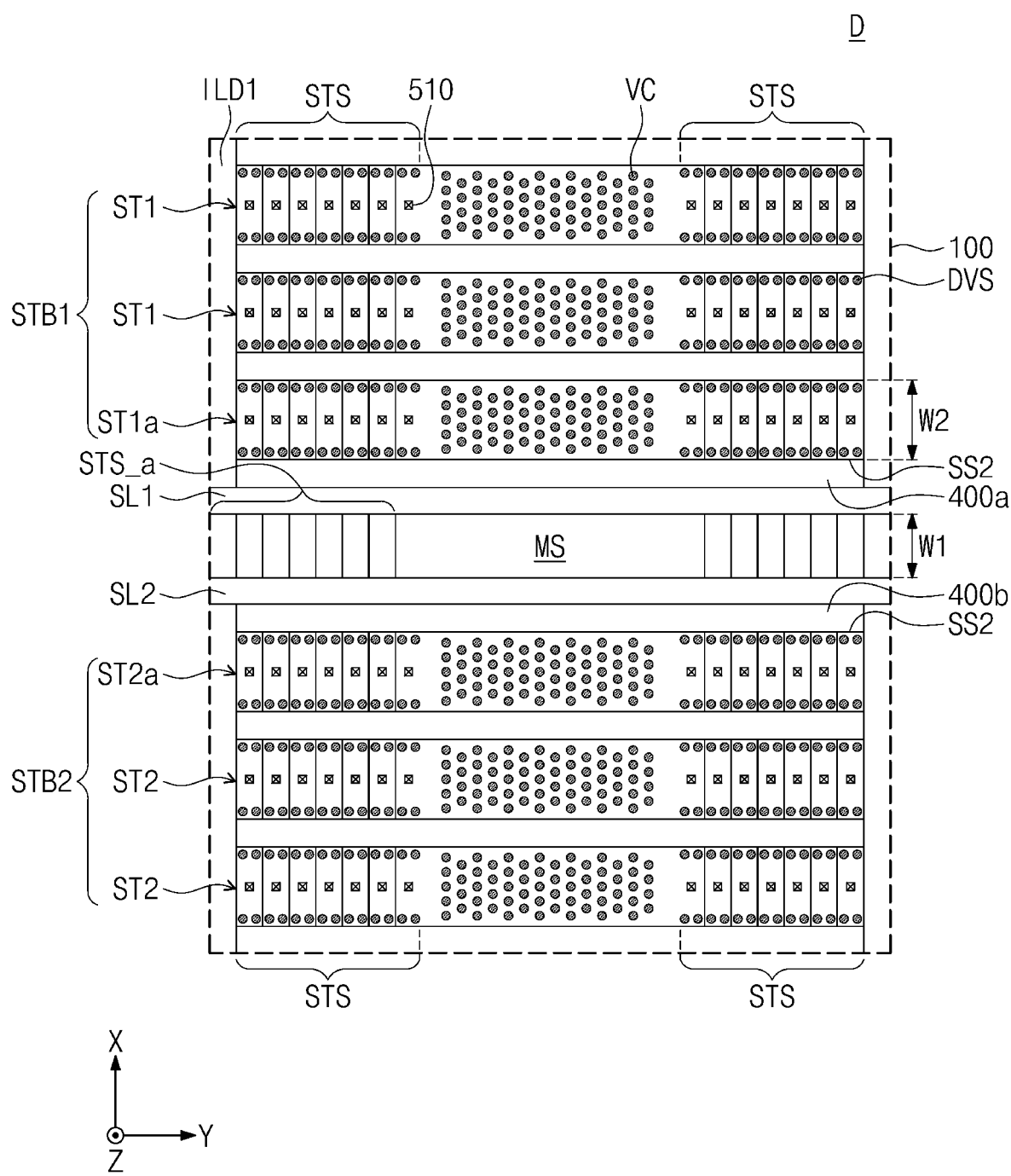
FIG. 17 is an enlarged plan view illustrating a portion 'D' of FIG. 16.

FIG. 16 is an enlarged plan view illustrating a semiconductor chip of FIG. 2. FIG. 17 is an enlarged plan view illustrating a portion 'D' of FIG. 16.

Referring to FIGS. 16 and 17, each of the unit chips USC may include the substrate 100, first stack blocks STB1 and second stack blocks STB2, which are provided on the top surface of the substrate 100, and the first interlayered insulating layer ILD1, which is provided on the top surface of the substrate 100 to cover side surfaces of the first and second stack blocks STB1 and STB2. The first stack blocks STB1 may be spaced apart from each other in the second direction Y, and the second stack blocks STB2 may be spaced apart from each other in the second direction Y. The first stack blocks STB1 and the second stack blocks STB2 may be provided to face each other in the first direction X.

A separation structure SRS extended lengthwise in the second direction Y may be provided between the first and second stack blocks STB1 and STB2, which face each other in the first direction X. The separation structure SRS may be provided on the top surface of the substrate 100 to penetrate the first interlayered insulating layer ILD1 in the third direction Z. The separation structure SRS may include the mold structures MS, the first separation layer SL1, and the second separation layer SL2. Each of the mold structures MS may be provided between the first and second stack blocks STB1 and STB2 facing each other in the first direction X. The mold structures MS may be spaced apart from each other in the second direction Y. The first separation layer SL1 may be extended lengthwise in the second direction Y between each of the mold structures MS and each of the first stack blocks STB1. The first separation layer SL1 may be provided on the top surface of the substrate 100 to penetrate the first interlayered insulating layer ILD1 in the third direction Z. The second separation layer SL2 may be extended lengthwise in the second direction Y between each of the mold structures MS and each of the second stack blocks STB2. The second separation layer SL2 may be provided on the top surface of the substrate 100 to penetrate the first interlayered insulating layer ILD1 in the third direction Z. Opposite ends of each of the mold structures MS in contact with the first interlayered insulating layer ILD1 may be provided to form the staircase structures STS_a. The opposite ends of each of the mold structures MS may be spaced apart from each other in the second direction Y.

Each of the first stack blocks STB1 may include the first stacks ST1 and ST1a, which are spaced apart from each other in the first direction X, and each of the second stack blocks STB2 may include the second stacks ST2 and ST2a, which are spaced apart from each other in the first direction X. In some embodiments, each of side surfaces of the first and second stack blocks STB1 and STB2 in contact with the separation structure SRS may be a flat surface that is perpendicular to the top surface of the substrate 100.

Each of the second side surfaces SS2 of the first stack ST1a and the second stack ST2a, which are located adjacent to the separation structure SRS, may be a flat surface that is perpendicular to the top surface of the substrate 100. The second side surfaces SS2 of the first and second stacks ST1a and ST2a may be parallel to the second direction Y and may be in contact with the first and second contact structures 400a and 400b, which are respectively interposed between the separation structure SRS and the first and second stacks ST1a and ST2a.

According to some embodiments, opposite ends of each of the first and second stacks ST1, ST1a, ST2, and ST2a in contact with the first interlayered insulating layer ILD1 may be provided to form the staircase structures STS. The opposite ends of each of the first and second stacks ST1, ST1a, ST2, and ST2a may be spaced apart from each other in the second direction Y. In some embodiments, the width W1 of the mold structure MS in the first direction X may be equal to the width W2 of each of the first and second stacks ST1, ST1a, ST2, and ST2a in the first direction X (i.e., W1=W2). In certain embodiments, the width W1 of the mold structure MS in the first direction X may be different from the width W2 of each of the first and second stacks ST1, ST1a, ST2, and ST2a in the first direction X (i.e., W1≠W2).

Figure 18:
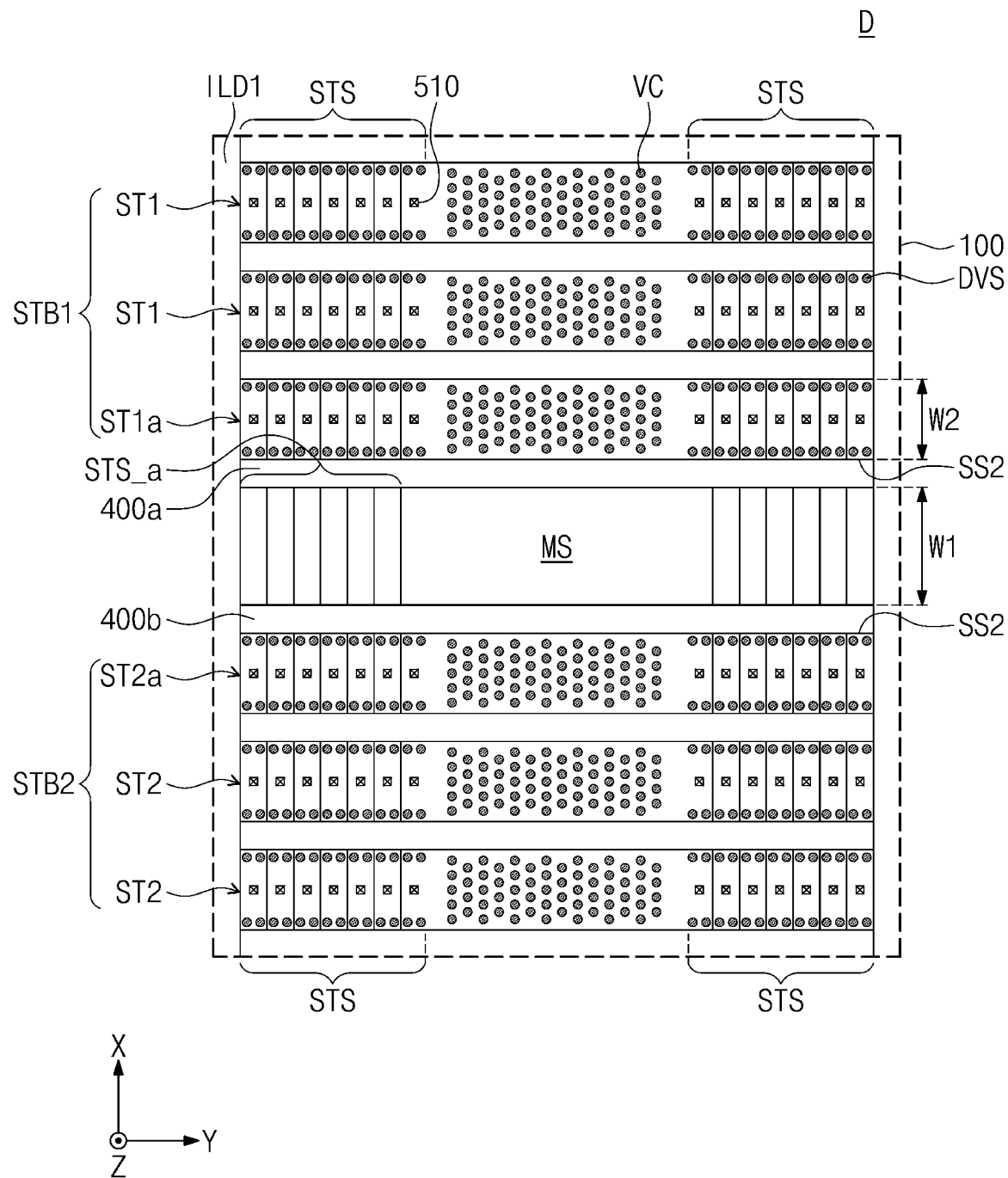
FIG. 18 is an enlarged plan view illustrating the portion 'D' of FIG. 16.

FIG. 18 is an enlarged plan view illustrating the portion 'D' of FIG. 16. For concise description, an element described with reference to FIGS. 16 and 17 may be identified by the same reference number without repeating an overlapping description thereof.

Referring to FIG. 18, the first contact structure 400a between the first stack ST1a and the separation structure SRS may be in direct contact with the mold structure MS of the separation structure SRS, and the second contact structure 400b between the second stack ST2a and the separation structure SRS may be in direct contact with the mold structure MS of the separation structure SRS. In other words, in the present embodiments, the first separation layer SL1 and the second separation layer SL2 may be omitted from the separation structure SRS.

In some embodiments, the width W1 of the mold structure MS in the first direction X may be larger than the width W2 of each of the first and second stacks ST1, ST1a, ST2, and ST2a in the first direction X (i.e., W1>W2).

FIGS. 19A to 22A are sectional views, which are taken along line I-I' of FIG. 4 to illustrate a method of fabricating a three-dimensional semiconductor memory device according to example embodiments. FIGS. 19B to 22B are sectional views, which are taken along line II-IP of FIG. 4 to illustrate a method of fabricating a three-dimensional semiconductor memory device according to example embodiments.

Figure 19A:
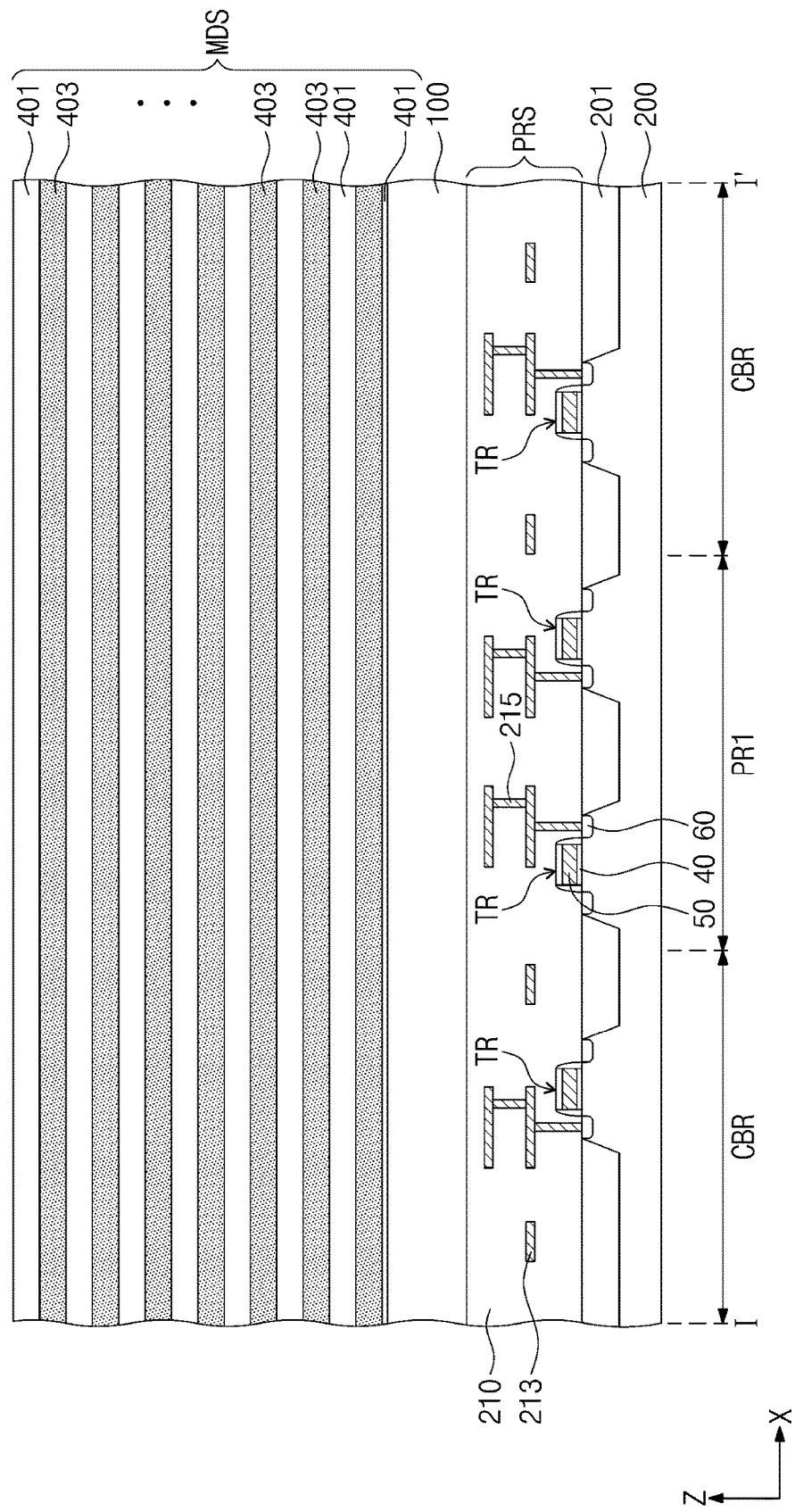
Figure 19B:
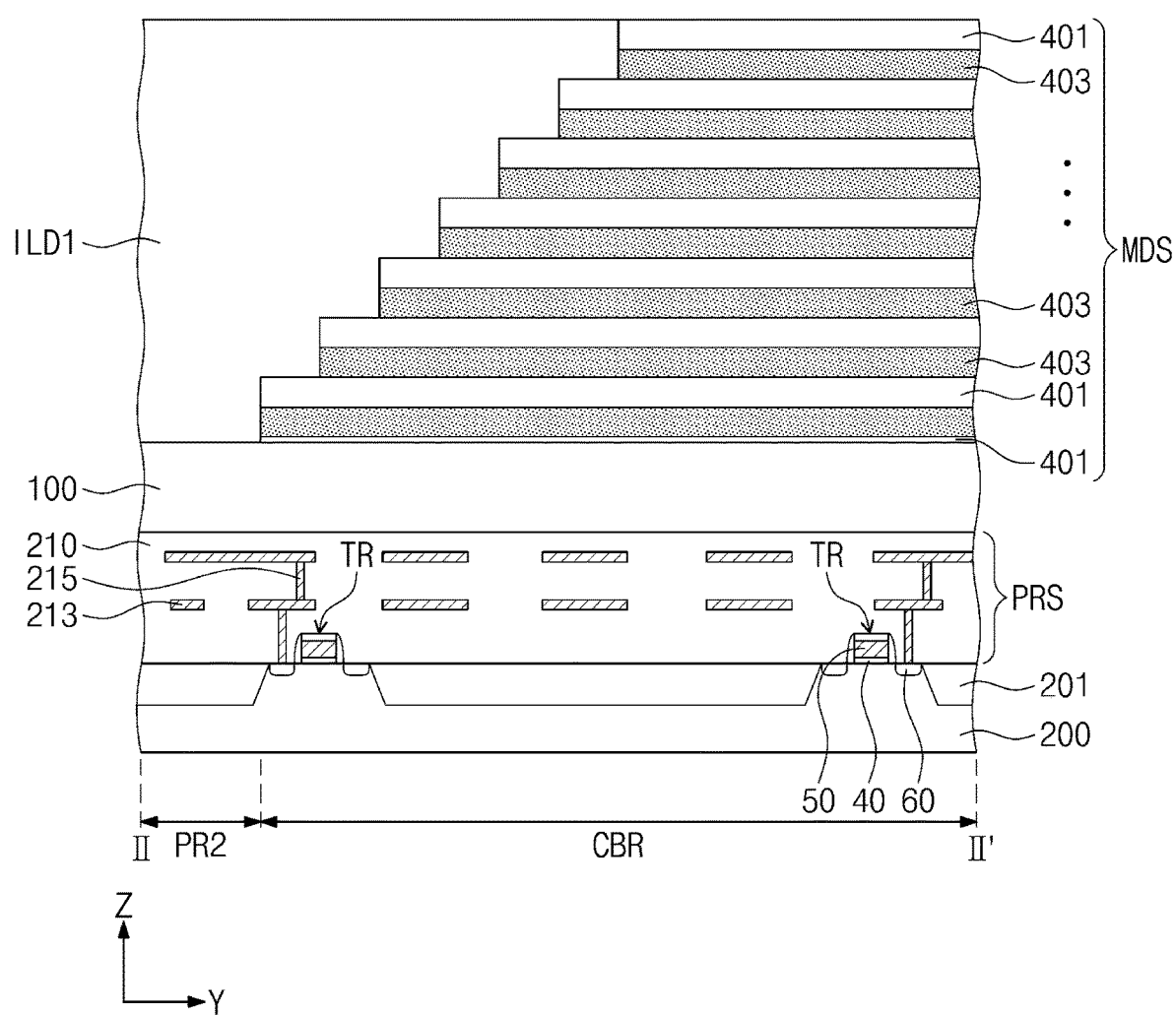

Referring to FIGS. 19A and 19B, the device isolation layer 201 may be provided in the lower substrate 200. The device isolation layer 201 may define active regions of the lower substrate 200. The peripheral circuit structure PRS may be provided on the lower substrate 200. The peripheral circuit structure PRS may include the transistors TR, the interconnection pads 213, the vias 215, and the peripheral interlayered insulating layer 210. The transistors TR may be formed on the active regions of the lower substrate 200. The transistors TR may include the peripheral gate insulating layer 40, the peripheral gate electrode 50 and the source/drain regions 60. The peripheral interlayered insulating layer 210 may be formed on the lower substrate 200. The peripheral interlayered insulating layer 210 may be formed to cover the transistors TR. The interconnection pads 213 and the vias 215 may be formed in the peripheral interlayered insulating layer 210.

The substrate 100 may be provided on the peripheral circuit structure PRS. The substrate 100 may include the cell block regions CBR and the peripheral region PR1 and PR2.

Mold structures MDS may be formed on the cell block regions CBR of the substrate 100. The mold structures MDS may be provided on the top surface of the substrate 100 to be spaced apart from each other in the second direction Y. The formation of the mold structures MDS may include alternately and repeatedly forming insulating layers 401 and sacrificial layers 403 on the substrate 100. The insulating layers 401 may be formed of or include, for example, silicon oxide. The sacrificial layers 403 may be formed of or include, for example, silicon nitride.

An edge region of each of the mold structures MDS may be patterned to form a staircase structure. The patterning of the mold structure MDS may include forming a mask pattern (not shown) on the mold structure MDS to expose the edge region of the mold structure MDS, etching the insulating layers 401 and the sacrificial layers 403 using the mask pattern as an etch mask, and reducing a width of the mask pattern (not shown) to increase an planar area of an etch-target layer (e.g., the insulating layers 401 and the sacrificial layers 403). In some embodiments, the etching and reducing steps may be repeatedly performed at least two times. Top surfaces of end portions of the insulating layers 401 may be exposed in the edge region of the mold structure MDS. An end portion of the lowermost layer of the insulating layers 401 may be covered with the lowermost layer of the sacrificial layers 403. Lengths of the sacrificial layers 403 in the second direction Y may decrease with increasing distance from the substrate 100, and lengths of the insulating layers 401 in the second direction Y may decrease with increasing distance from the substrate 100.

The first interlayered insulating layer ILD1 may be formed to cover side surfaces of the mold structures MDS and the top surface of the substrate 100. For example, the first interlayered insulating layer ILD1 may be formed to cover the staircase structures of the mold structures MDS. The first interlayered insulating layer ILD1 may be formed to expose top surfaces of the mold structures MDS. For example, the first interlayered insulating layer ILD1 may be formed to expose top surfaces of the uppermost ones of the insulating layers 401. The first interlayered insulating layer ILD1 may be formed of or may include, for example, at least one of TEOS oxide or silicon oxide.

Figure 20A:
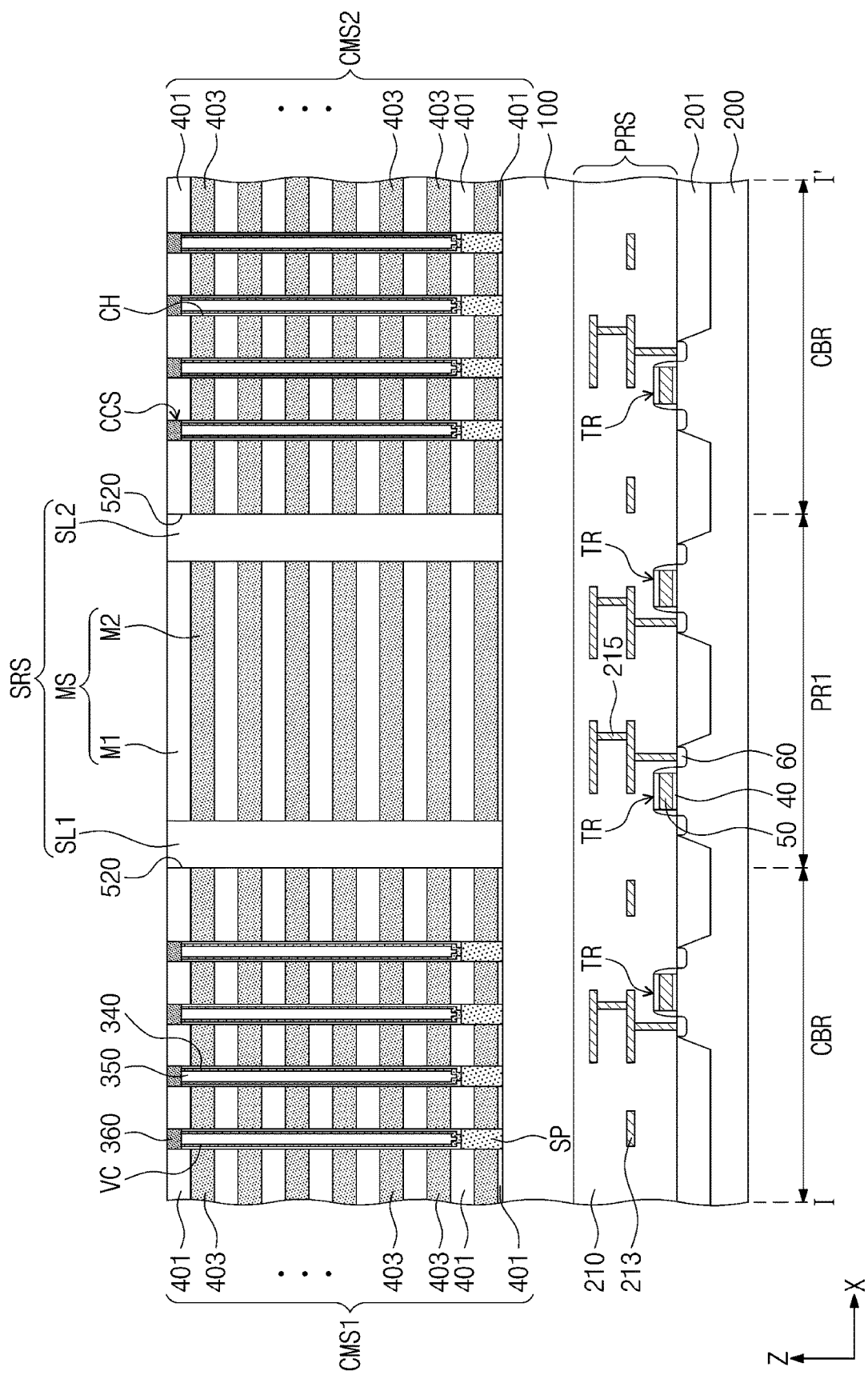
Figure 20B:
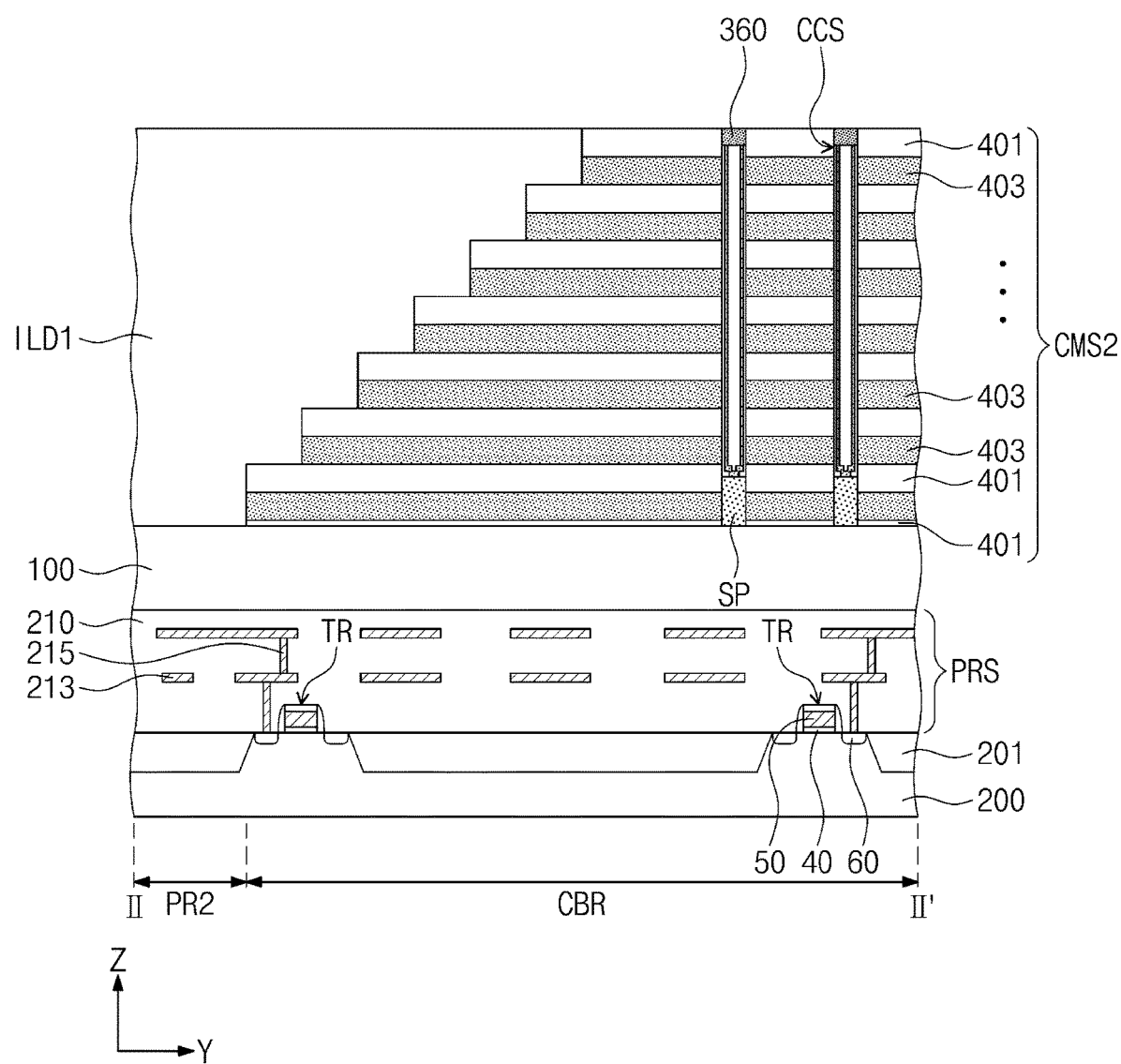

Referring to FIGS. 20A and 20B, the first separation layer SL1 and the second separation layer SL2 may be formed in each of the mold structures MDS. The formation of the first separation layer SL1 and the second separation layer SL2 may include performing an anisotropic etching process to etch the mold structure MDS and the first interlayered insulating layer ILD1 and to form trenches 520 in the mold structure MDS and the first interlayered insulating layer ILD1, filling the trenches 520 with an insulating material, and performing a planarization process on the insulating material. In some embodiments, the first and second separation layers SL1 and SL2 may be formed through an atomic layer deposition (ALD) process. The first and second separation layers SL1 and SL2 may be formed of or include, for example, silicon oxide.

The first and second separation layers SL1 and SL2 may be formed to divide each of the mold structures MDS into a first cell mold structure CMS1, a second cell mold structure CMS2, and a remaining mold structure MS between the first and second cell mold structures CMS1 and CMS2. The remaining mold structure MS may include the first mold layers M1 and the second mold layers M2, which are interposed between the first mold layers M1 adjacent to each other in the third direction Z. The first mold layers M1 may correspond to portions of the insulating layers 401 of the mold structure MDS, and the second mold layers M2 may correspond to portions of the sacrificial layers 403 of the mold structure MDS. The first and second separation layers SL1 and SL2 and the remaining mold structure MS may constitute the separation structure SRS. In some embodiments, the first and second cell mold structures CMS1 and CMS2 may be spaced apart from each other in the first and second directions X and Y with the separation structure SRS interposed therebetween.

According to some embodiments, the first and second separation layers SL1 and SL2 may be formed in the mold structure MDS to divide the mold structure MDS in to a plurality of cell mold structures CMS1 and CMS2. In this case, it may be possible to reduce planar areas of the cell mold structures CMS1 and CMS2, compared with the case of patterning an edge region of each of the cell mold structures CMS1 and CMS2 in a staircase structure. Thus, it may be possible to reduce a size of a final semiconductor chip, in which memory elements are three-dimensionally arranged.

The cell vertical channel structures CCS and the dummy channel structures DVS (e.g., see FIG. 4) may be formed in each of the first and second cell mold structures CMS1 and CMS2. Referring back to FIG. 7, the formation of the cell vertical channel structures CCS may include forming channel holes CH in each of the first and second cell mold structures CMS1 and CMS2 and forming the semiconductor pillar SP, the charge storing structure 340, the vertical channel portion VC, the gap-fill layer 350, and the pad 360 in each of the channel holes CH. Referring back to FIG. 12, the formation of the dummy channel structures DVS may include forming dummy holes (not shown) in each of the first and second cell mold structures CMS1 and CMS2 and forming the dummy semiconductor pillar SP', the dummy charge storing structure 340', the dummy vertical channel portion VC', the dummy gap-fill layer 350', and the dummy pad 360' in each of the dummy holes.

The semiconductor pillar SP may be grown from the substrate 100 by a selective epitaxial growth (SEG) process, in which the substrate 100 exposed by the channel hole CH is used as a seed layer. The charge storing structure 340 may be formed on an inner side surface of the channel hole CH and may cover a portion of the top surface of the substrate 100 exposed by the channel hole CH.

Referring back to FIG. 7, the charge storing structure 340 may include the blocking insulating layer BLL, the charge storing layer CTL, and the tunnel insulating layer TL, which are sequentially formed on the inner side surface of the channel hole CH. The vertical channel portion VC may be formed to conformally cover an inner side surface of the charge storing structure 340 and the portion of the top surface of the substrate 100 exposed by the charge storing structure 340. The gap-fill layer 350 may be formed in an internal space of the vertical channel portion VC. The gap-fill layer 350 may be formed to fill the remaining empty space of the channel hole CH provided with the vertical channel portion VC. In some embodiments, the gap-fill layer 350 may be formed by a spin-on-glass (SOG) method. The pad 360 may be formed on the vertical channel portion VC, the charge storing structures 340, and the gap-fill layer 350. A method for forming the dummy channel structures DVS may be the same as that for the cell vertical channel structures CCS, and thus, a detailed description thereof will be omitted herein.

Figure 21A:
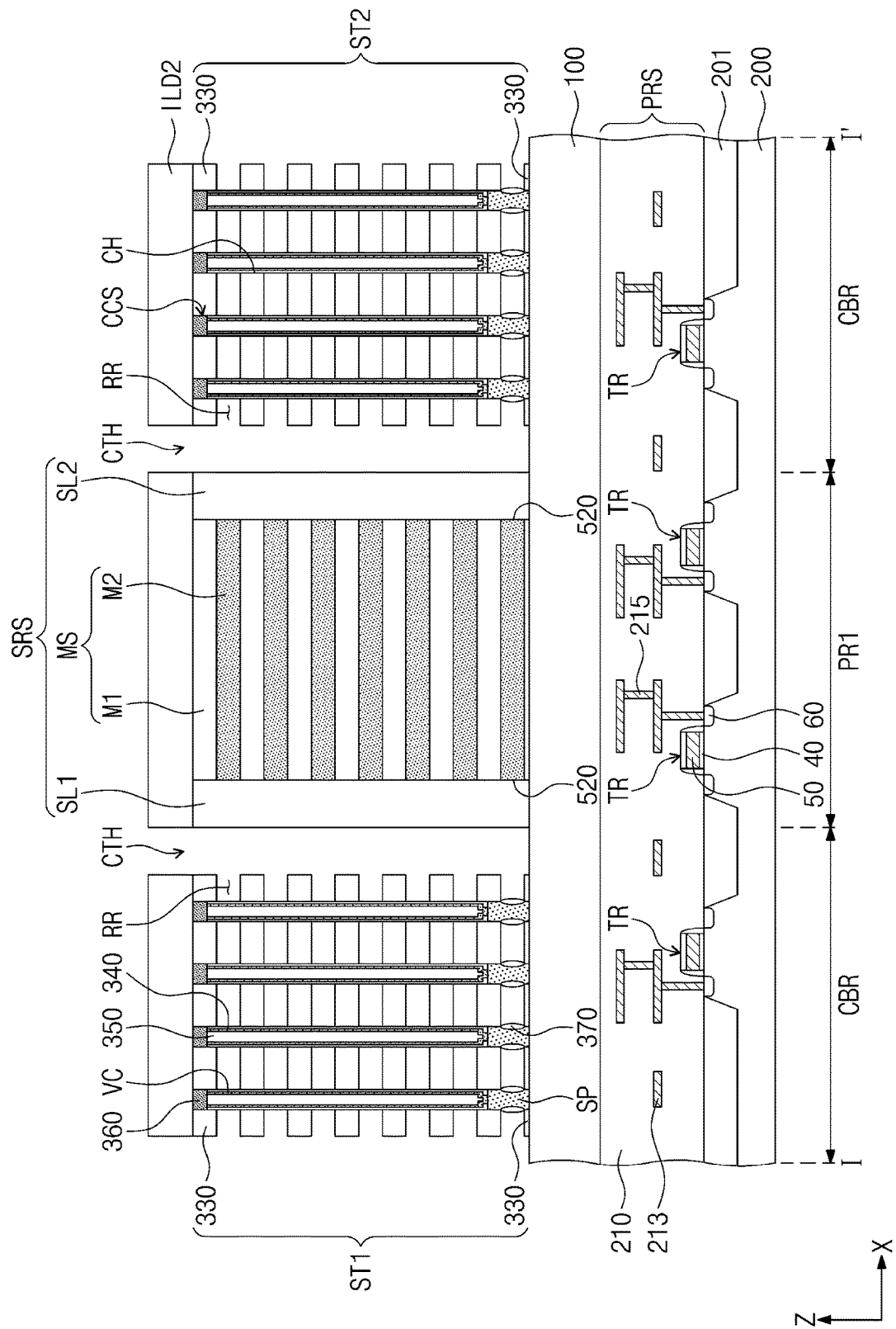
Figure 21B:
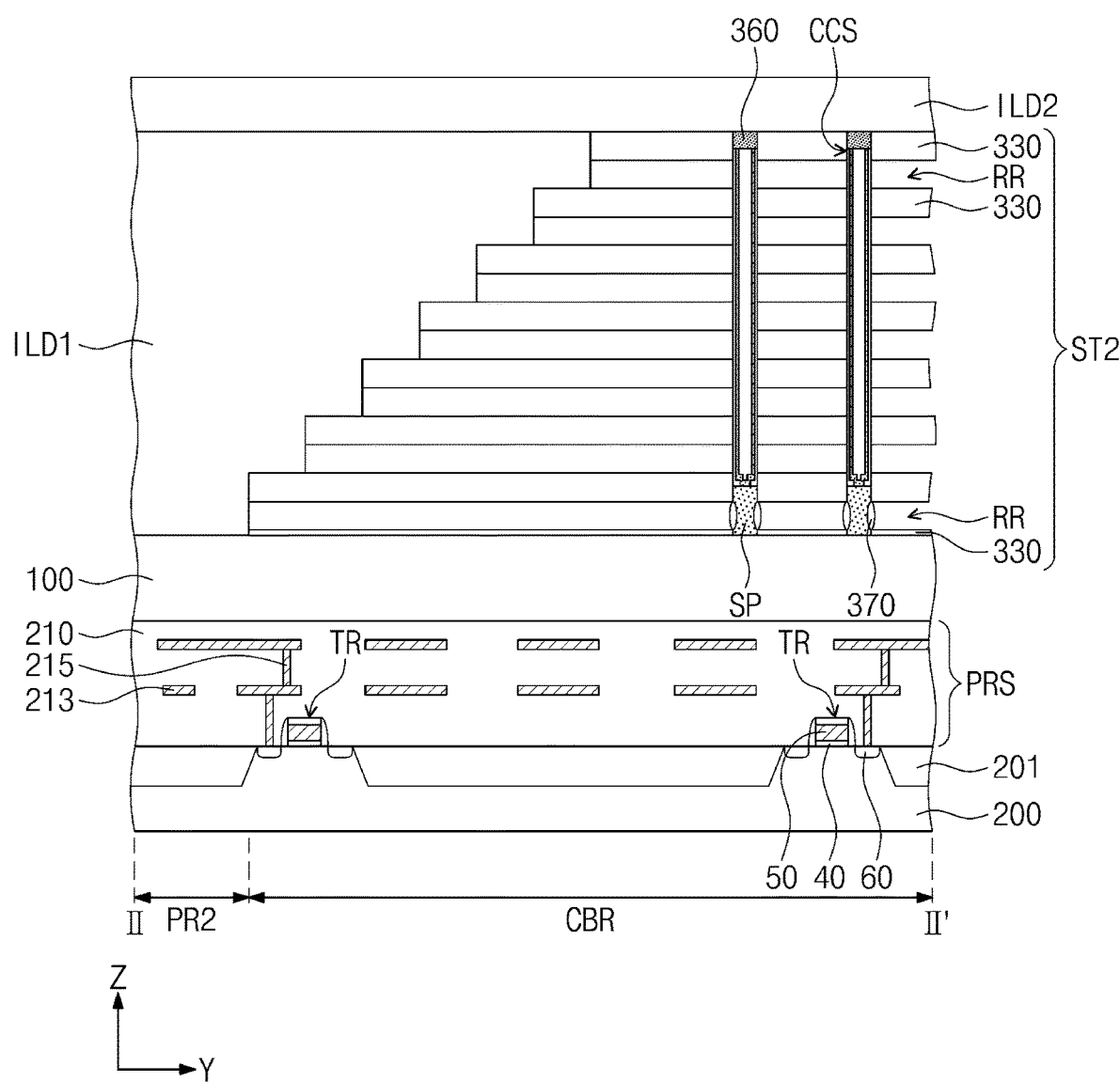

Referring to FIGS. 21A and 21B, an anisotropic etching process may be performed on each of the first and second cell mold structures CMS1 and CMS2 to form common source trenches CTH. The formation of the common source trenches CTH may include forming the second interlayered insulating layer ILD2 on the first and second cell mold structures CMS1 and CMS2 and then etching the first and second cell mold structures CMS1 and CMS2 using the second interlayered insulating layer ILD2 as an etch mask to expose the top surface of the substrate 100. The common source trenches CTH may be formed to extend lengthwise in the second direction Y. The common source trenches CTH may be formed to expose side surfaces of the first and second separation layers SL1 and SL2. As a result of the formation of the common source trenches CTH, the stacks ST1 and ST2, which are spaced apart from each other in the first direction X, may be formed on the substrate 100. Each of the stacks ST1 and ST2 may include the insulating patterns 330 and the sacrificial patterns (not shown).

The sacrificial patterns exposed by the common source trenches CTH may be removed to form recess regions RR. The sacrificial patterns may be removed by a wet etching process and/or an isotropic dry etching process. The recess regions RR may be formed between the insulating patterns 330 adjacent to each other in the third direction Z. For example, the recess regions RR may be formed between horizontally adjacent ones of the insulating patterns 330. The etching process may be performed using an etching solution containing phosphoric acid. The gate insulating layer 370 and the dummy gate insulating layer 370' (e.g., see FIG. 12) may be formed on side surfaces of the semiconductor pillar SP and the dummy semiconductor pillar SP' (e.g., see FIG. 12), which are exposed by the recess regions RR. The gate insulating layer 370 and the dummy gate insulating layer 370' may be formed of or may include, for example, a thermally grown oxide layer or a silicon oxide layer.

The horizontal insulating layer 380 (e.g., see FIG. 7) may be formed in the recess regions RR. For example, the horizontal insulating layer 380 may be formed to conformally cover elements exposed by the recess regions RR (e.g., exposed surfaces of the insulating patterns 330, the charge storing structures 340, the first interlayered insulating layer ILD1, the second interlayered insulating layer ILD2, and the first and second separation layers SL1 and SL2). The horizontal insulating layer 380 may be formed by a deposition process (e.g., CVD or ALD) providing a good step coverage property.

Figure 22A:
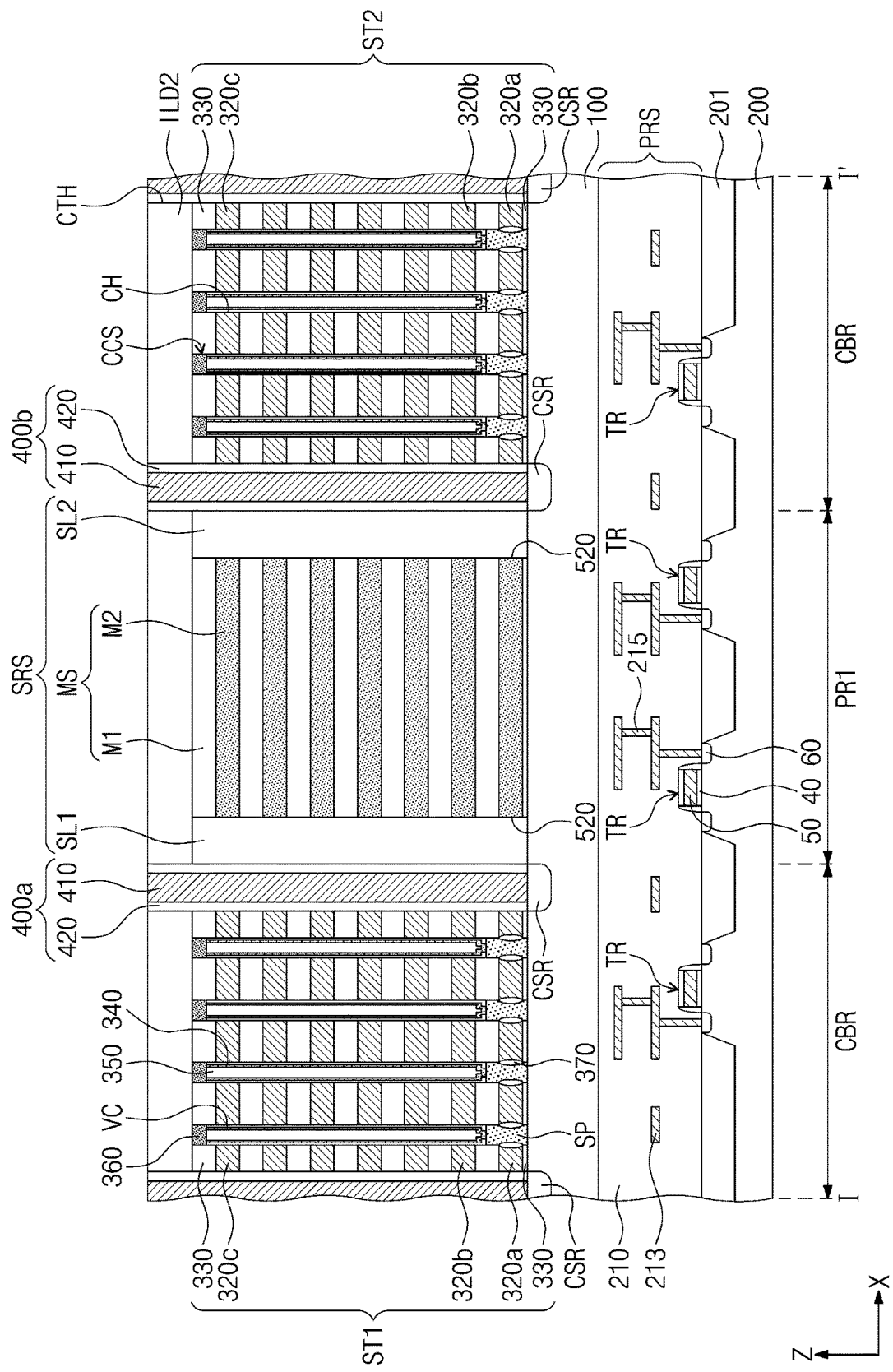
Figure 22B:
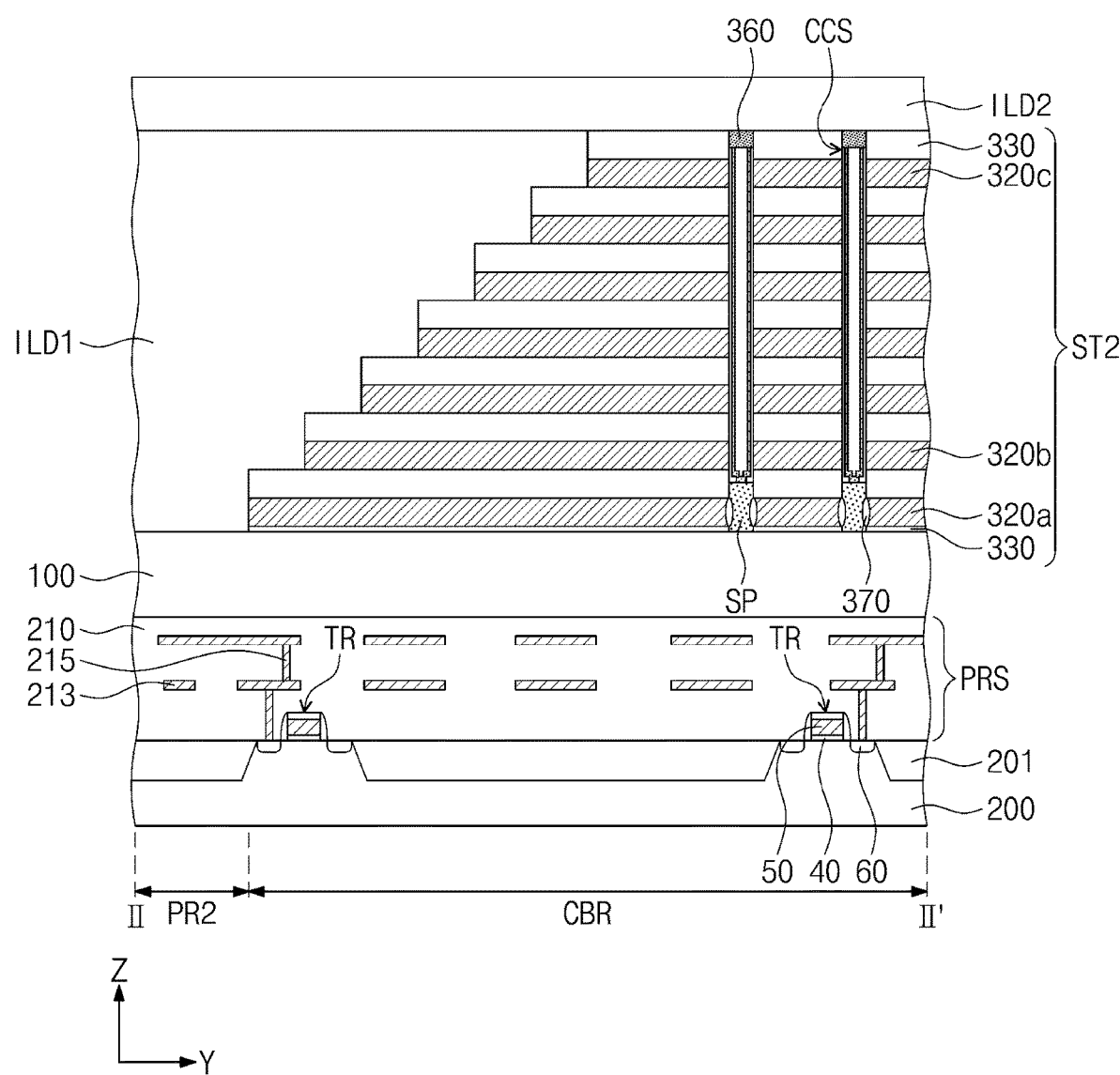

Referring to FIGS. 22A and 22B, the gate electrodes 320a, 320b, and 330c may be formed in the recess regions RR, respectively. The formation of the gate electrodes 320a, 320b, and 330c may include forming a metal layer to fill the common source trenches CTH and the recess regions RR and removing the metal layer from the common source trenches CTH. The common source regions CSR may be formed in the substrate 100 exposed by the common source trenches CTH. The common source regions CSR may be formed through an ion implantation process.

The contact structures 400a and 400b may be formed in the common source trenches CTH. Each of the contact structures 400a and 400b may include the spacer 420 and the common source contact 410. The spacer 420 may be formed to cover side surfaces of common source trench CTH. The common source contact 410 may be formed to fill a remaining empty space of each of the common source trenches CTH provided with the spacer 420.

Referring back to FIGS. 5 and 6, the third interlayered insulating layer ILD3 may be formed on the second interlayered insulating layer ILD2. The third interlayered insulating layer ILD3 may be formed to cover top surfaces of the contact structures 400a and 400b and the second interlayered insulating layer ILD2. The third interlayered insulating layer ILD3 may be formed of or may include, for example, a silicon oxide layer.

The channel contact plugs CCP may be formed on the pads 360, and the cell contact plugs 510 may be formed on the end portions of the gate electrodes 320a, 320b, and 320c. In addition, the first peripheral contact plugs PCP1 connected to the transistors TR may be formed in the mold structure MS, and the second peripheral contact plugs PCP2 connected to the transistors TR may be formed in the first interlayered insulating layer ILD1. The channel contact plugs CCP, the cell contact plugs 510, and the first and second peripheral contact plugs PCP1 and PCP2 may be formed of or may include, for example, a metal layer or a metal silicide layer.

The first and second bit lines BL1 and BL2 and the interconnection lines ICN may be formed on the third interlayered insulating layer ILD3. The first bit lines BL1 may be formed on the first stack ST1, and the second bit lines BL2 may be formed on the second stack ST2. The first and second bit lines BL1 and BL2 may be electrically connected to the channel contact plugs CCP, and the interconnection lines ICN may be electrically connected to the cell contact plugs 510 and the first and second peripheral contact plugs PCP1 and PCP2.

Figure 23:
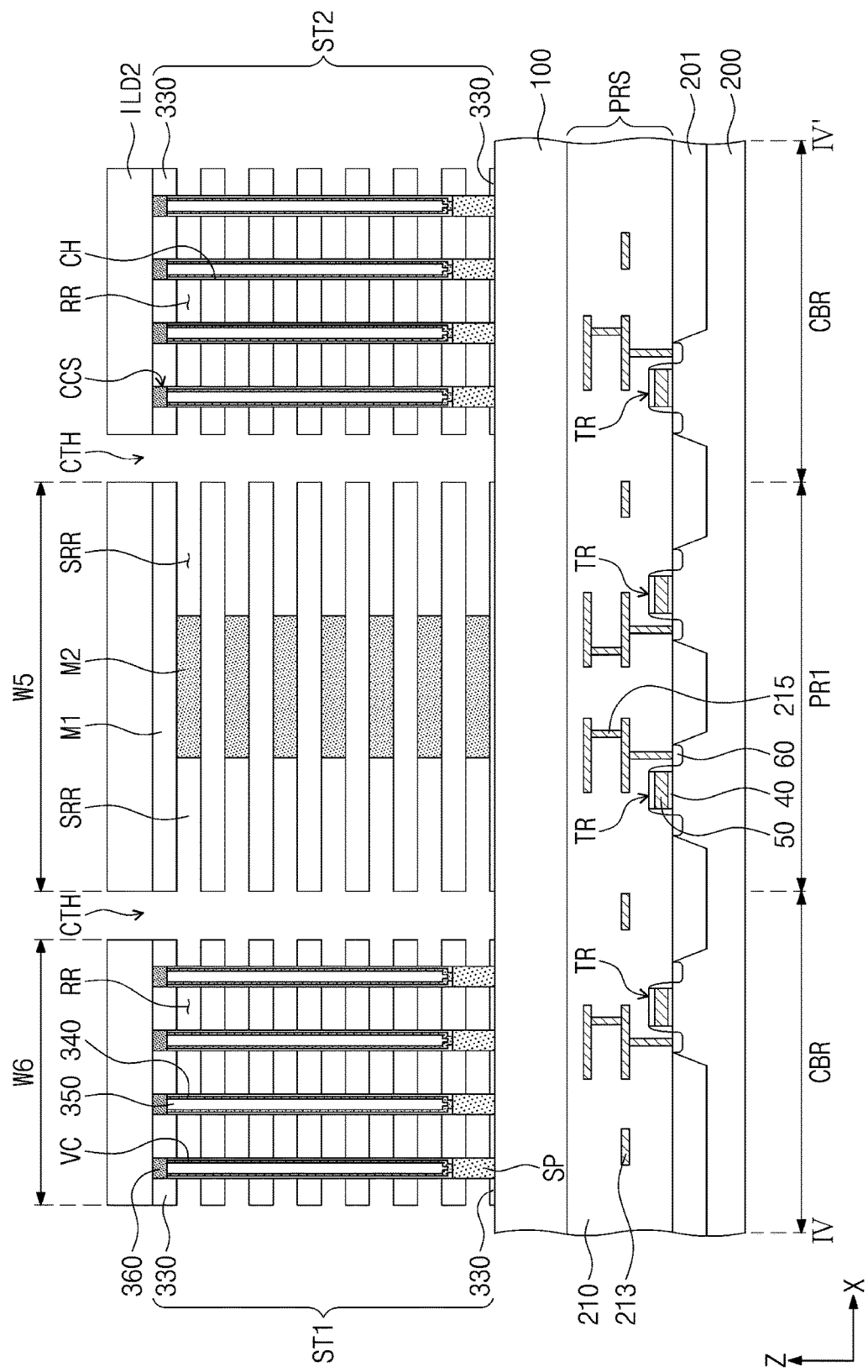
FIGS. 23 and 24 are sectional views, which are taken along line IV-IV' of FIG. 13, to illustrate a method of fabricating a three-dimensional semiconductor memory device according to example embodiments.
Figure 24:
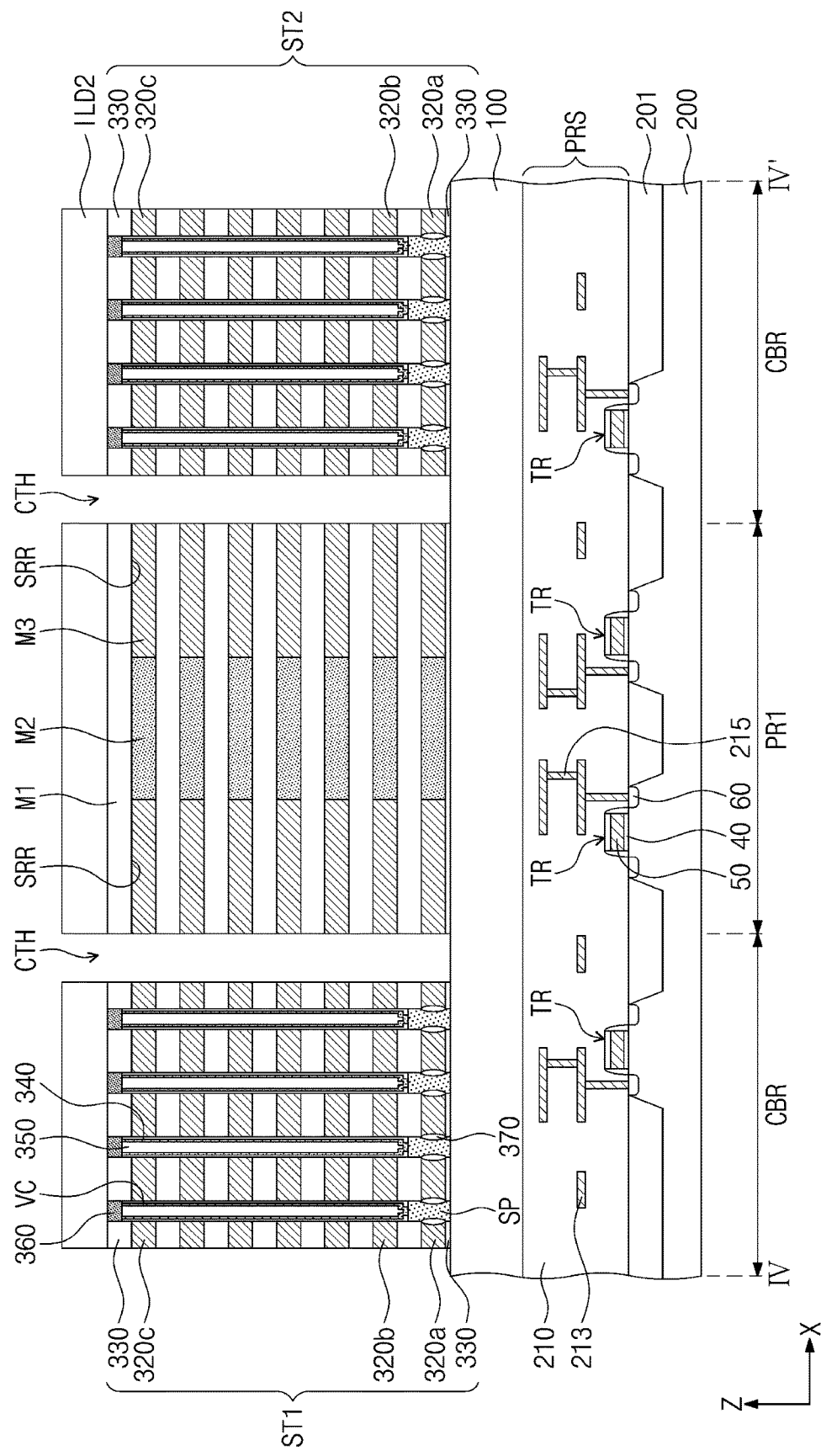

FIGS. 23 and 24 are sectional views, which are taken along line IV-IV' of FIG. 13 to illustrate a method of fabricating a three-dimensional semiconductor memory device according to example embodiments. For concise description, a previously described element or step may be identified by the same reference number without repeating an overlapping description thereof.

Referring to FIG. 23, a process for forming the first separation layer SL1 and the second separation layer SL2 may be omitted. The first and second mold layers M1 and M2 may be formed when the mold structure MS is divided into first and second stacks ST1 and ST2 by the common source trenches CTH formed in the mold structure MS. In this case, widths W5 of the first and second mold layers M1 and M2 in the first direction X may be larger than widths W6 of the first and second stacks ST1 and ST2 in the first direction X (i.e., W5>W6).

When the recess regions RR are formed by removing the sacrificial patterns (not shown), separation recess regions SRR may be formed between the first mold layers M1, which are adjacent to each other in the third direction Z, of the separation structure SRS. The separation recess regions SRR may be extended from the common source trenches CTH to a region between the first mold layers M1 adjacent to each other in the third direction Z in the first direction X. Since widths of the second mold layers M2 of the separation structure SRS are larger than widths of sacrificial layers of the first and second stacks ST1 and ST2, the second mold layers M2 of the separation structure SRS may not be completely removed, even when the sacrificial patterns are completely removed. In other words, the second mold layers M2 may remain between the first mold layers M1.

Referring to FIGS. 15 and 24, the third mold layers M3 may be formed in the separation recess regions SRR, respectively. Each of the third mold layers M3 may include the insulating mold layer IML and the metal mold layer MML. The insulating mold layer IML and the horizontal insulating layer 380 may be concurrently formed through the same process, and the metal mold layer MML and the gate electrodes 220a, 220b, and 220c may also be concurrently formed through the same process.

According to some embodiments, first and second separation layers may be formed in a mold structure to divide the mold structure into a plurality of cell mold structures. A size of the mold structure may be reduced, compared to the case of patterning an edge region of each of the cell mold structures in a staircase structure. Thus, it may be possible to reduce a size of a final semiconductor chip, in which memory elements are three-dimensionally arranged.

While example embodiments of the inventive concepts have been particularly shown and described, it will be understood by one of ordinary skill in the art that variations in form and detail may be made therein without departing from the spirit and scope of the attached claims.

What is claimed is:

1. A three-dimensional semiconductor memory device, comprising:
   a substrate;
   a stack structure including insulating patterns and gate electrodes, which are alternately and repeatedly stacked on the substrate; and
   a separation structure extending in at least one of a first direction and a second direction crossing the first direction, and dividing the stack structure,
   wherein the stack structure has a rectangular shape with four side regions, at least one of the side regions of the stack structure having a staircase structure,
   wherein the separation structure extends from one side region of the stack structure to another side region of the stack structure, opposing to the one side region,
   wherein the separation structure includes separation layers extending in a third direction perpendicular to a top surface of the substrate and a mold structure between the separation layers, and
   wherein at least one of end portions of the separation structure has a staircase structure.

2. The device of claim 1,
   wherein the mold structure includes first mold layers which are stacked in the third direction, and second mold layers which are interposed between a corresponding pair of the first mold layers adjacent to each other in the third direction, and
   wherein the first mold layers and the second mold layers comprise insulating materials different from each other.

3. The device of claim 2, wherein each of the first mold layers is an oxide layer, and each of the second mold layers is a nitride layer.

4. The device of claim 2, wherein the mold structure further includes third mold layers which are provided between the first mold layers adjacent to each other in the third direction and are horizontally spaced apart from each other by respective one of the second mold layers interposed therebetween.

5. The device of claim 4, wherein each of the third mold layers has a side surface which is in contact with the one of the second mold layers, and an opposite side surface which is aligned to side surfaces of the first mold layers.

6. The device of claim 1,
   wherein the separation structure extends in the first direction and the second direction, and divides the stack structure into first to fourth stack blocks, the separation structure including a first portion extending lengthwise in the first direction and a second portion extending lengthwise in the second direction, wherein the first portion of the separation structure is disposed between the first stack block and the second stack block, and between the third stack block and the fourth stack block, and wherein the second portion of the separation structure is disposed between the first stack block and the third stack block, and between the second stack block and the fourth stack block.

7. The device of claim 6, wherein the separation layers include first to fourth separation layers, and wherein the first separation layer is between the first stack block and the mold structure, the second separation layer is between the second stack block and the mold structure, the third separation layer is between the third stack block and the mold structure, the fourth separation layer is between the fourth stack block and the mold structure.

8. The device of claim 7, wherein each of the first to fourth separation layers comprises a single layer.

9. The device of claim 6, wherein each of the first to fourth stack blocks includes a plurality of stacks extending lengthwise in the second direction and being spaced apart from each other in the first direction, and wherein a width of the separation structure in the first direction is larger than a width of each of the plurality of stacks in the first direction.

10. The device of claim 6, further comprising:

a contact structure between the separation structure and each of the first to fourth stack blocks, wherein the separation structure is in contact with the contact structure.

11. The device of claim 1, further comprising:

a lower substrate provided below the substrate;

a peripheral circuit structure provided between the substrate and the lower substrate, the peripheral circuit structure including a peripheral circuit transistor; and a plurality of through insulating patterns penetrating the stack structure and the substrate.

12. A three-dimensional semiconductor memory device, comprising:

a substrate;

a stack structure including insulating patterns and gate electrodes, which are alternately and repeatedly stacked on the substrate;

a separation structure extending in at least one of a first direction and a second direction crossing the first direction, and dividing the stack structure, a lower substrate provided below the substrate;

a peripheral circuit structure provided between the substrate and the lower substrate, the peripheral circuit structure including a peripheral circuit transistor; and a peripheral contact plug penetrating the separation structure and the substrate, and electrically connected to the peripheral circuit transistor of the peripheral circuit structure, wherein the stack structure has a rectangular shape with four side regions, at least one of the side regions of the stack structure having a staircase structure, wherein the separation structure extends from one side region of the stack structure to another side region of the stack structure, opposing to the one side region, wherein the separation structure includes separation layers extending in a third direction perpendicular to a top surface of the substrate and a mold structure between the separation layers, and wherein at least one of end portions of the separation structure has a staircase structure.

13. The device of claim 12, wherein the mold structure includes first mold layers and second mold layers, which are alternately and repeatedly stacked on the substrate, wherein each of the first mold layers is located at the same level as a corresponding one of the insulating patterns, wherein each of the second mold layers is located at the same level as a corresponding one of the gate electrodes, and wherein the first mold layers and the second mold layers comprise insulating materials different from each other.

14. The device of claim 13, wherein the peripheral contact plug penetrates the first and second mold layers of the mold structure, and wherein the peripheral contact plug is horizontally spaced apart from the separation layers.

15. The device of claim 12, wherein the separation structure extends in the first direction and the second direction, and divides the stack structure into first to fourth stack blocks, the separation structure including a first portion extending lengthwise in the first direction and a second portion extending lengthwise in the second direction, wherein the first portion of the separation structure is disposed between the first stack block and the second stack block, and between the third stack block and the fourth stack block, and wherein the second portion of the separation structure is disposed between the first stack block and the third stack block, and between the second stack block and the fourth stack block.

16. The device of claim 15, further comprising:

a contact structure extending lengthwise in the second direction between the separation structure and each of the first to fourth stack blocks, wherein each of the separation layers of the separation structure is in contact with the contact structure.

17. A three-dimensional semiconductor memory device, comprising:

a block disposed on a substrate; and a separation structure dividing the block into first to fourth stack blocks, the separation structure having a cross shape and including a first portion extending lengthwise in a first direction and a second portion extending lengthwise in a second direction perpendicular to the first direction, wherein at least a portion of an edge region of the block has a staircase structure, wherein the separation structure includes separation layers and a mold structure between the separation layers, and wherein at least one of end portions of the separation structure has a staircase structure.

18. The device of claim 17, further comprising:

an interlayered insulating layer provided on the substrate to cover the staircase structure of the block and the staircase structure of the separation structure, wherein the separation layers are extended into the interlayered insulating layer.

19. The device of claim 17, wherein the mold structure includes first mold layers and second mold layers, which comprising insulating materials different from each other, wherein the first mold layers are stacked in a vertical direction perpendicular to a top surface of the substrate, and wherein each of the second mold layers is interposed between a corresponding pair of the first mold layers adjacent to each other in the vertical direction.

20. The device of claim 19, wherein the mold structure further includes metal mold layers, which are provided between the first mold layers adjacent to each other in the vertical direction and are horizontally spaced apart from each other by each of the second mold layers interposed therebetween.

* * * * *